United States Patent
Yokoyama

(10) Patent No.: US 11,950,403 B2
(45) Date of Patent: Apr. 2, 2024

(54) WIDENED CONDUCTIVE LINE STRUCTURES AND STAIRCASE STRUCTURES FOR SEMICONDUCTOR DEVICES

(71) Applicant: Micron Technology, Inc., Boise, ID (US)

(72) Inventor: Yuichi Yokoyama, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 192 days.

(21) Appl. No.: 17/078,201

(22) Filed: Oct. 23, 2020

(65) Prior Publication Data

US 2022/0130830 A1  Apr. 28, 2022

(51) Int. Cl.
*H10B 12/00* (2023.01)
*H01L 23/522* (2006.01)

(52) U.S. Cl.
CPC ......... *H10B 12/30* (2023.02); *H01L 23/5226* (2013.01); *H10B 12/01* (2023.02)

(58) Field of Classification Search
CPC ......... H01L 27/10805; H01L 27/10844; H01L 27/0688; H01L 27/1088; H01L 27/10894; H01L 27/10897; H01L 27/1116; H01L 27/0207; H01L 23/5226; H10B 12/30; H10B 12/01; H10B 12/485; H10B 12/09; H10B 12/50; H10B 10/18
See application file for complete search history.

(56) References Cited

U.S. PATENT DOCUMENTS

| | | | |
|---|---|---|---|
| 5,866,928 A * | 2/1999 | Siek | G11C 11/4091 365/72 |
| 10,607,995 B2 | 3/2020 | Roberts et al. | |
| 2010/0097859 A1* | 4/2010 | Shim | G11C 5/02 365/185.05 |
| 2014/0027838 A1* | 1/2014 | Kido | H01L 29/66833 438/269 |
| 2016/0027730 A1 | 1/2016 | Lee | |
| 2017/0358594 A1* | 12/2017 | Lu | H10B 41/27 |
| 2018/0145029 A1 | 5/2018 | Tanzawa | |
| 2018/0323200 A1 | 11/2018 | Tang et al. | |
| 2018/0337192 A1 | 11/2018 | Kim et al. | |
| 2019/0103406 A1 | 4/2019 | Tang et al. | |

(Continued)

OTHER PUBLICATIONS

U.S. Appl. No. 16/204,224, entitled, "Memory Arrays," filed Nov. 29, 2018, 43 pages.

(Continued)

*Primary Examiner* — Sophia T Nguyen
*Assistant Examiner* — John Lin
(74) *Attorney, Agent, or Firm* — Brooks, Cameron & Huebsch, PLLC

(57) ABSTRACT

Systems, methods, and apparatuses for widened conductive line structures and staircase structures for semiconductor devices are described herein. One memory device includes an array of vertically stacked memory cells, the array including a vertical stack of horizontally oriented conductive lines. Each conductive line comprises a first portion extending in a first horizontal direction and a second portion extending in a second horizontal direction, wherein the second portion of each conductive line is of a width greater than the first portion of each conductive line.

11 Claims, 28 Drawing Sheets

(56) References Cited

U.S. PATENT DOCUMENTS

| | | |
|---|---|---|
| 2019/0164985 A1 | 5/2019 | Lee et al. |
| 2020/0227418 A1 | 7/2020 | Kim et al. |
| 2020/0411523 A1* | 12/2020 | Shin .................. H01L 27/10808 |
| 2021/0183861 A1* | 6/2021 | Lee ........................ H10B 12/03 |

OTHER PUBLICATIONS

International Search Report and Written Opinion from related international patent application No. PCT/US2021/042506, dated Nov. 5, 2021, 10 pages.

\* cited by examiner

WIDENED CONDUCTIVE LINE STRUCTURES AND STAIRCASE STRUCTURES FOR SEMICONDUCTOR DEVICES

TECHNICAL FIELD

The present disclosure relates generally to memory devices, and more particularly, to widened conductive line structures and staircase structures for semiconductor devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, (e.g., a transistor), having a first and a second source/drain regions separated by a channel region. A gate may oppose the channel region and be separated therefrom by a gate dielectric. An access line, such as a world line, is electrically connected to the gate of the DRAM cell. A DRAM cell can include a storage node, such as a capacitor cell, coupled by the access device to a conductive line. The access device can be activated (e.g., to select the cell) by an access line coupled to an access transistor. The capacitor can store a charge corresponding to a data value of a respective cell (e.g., a logic "1" or "0").

DETAILED DESCRIPTION

Figure 1:
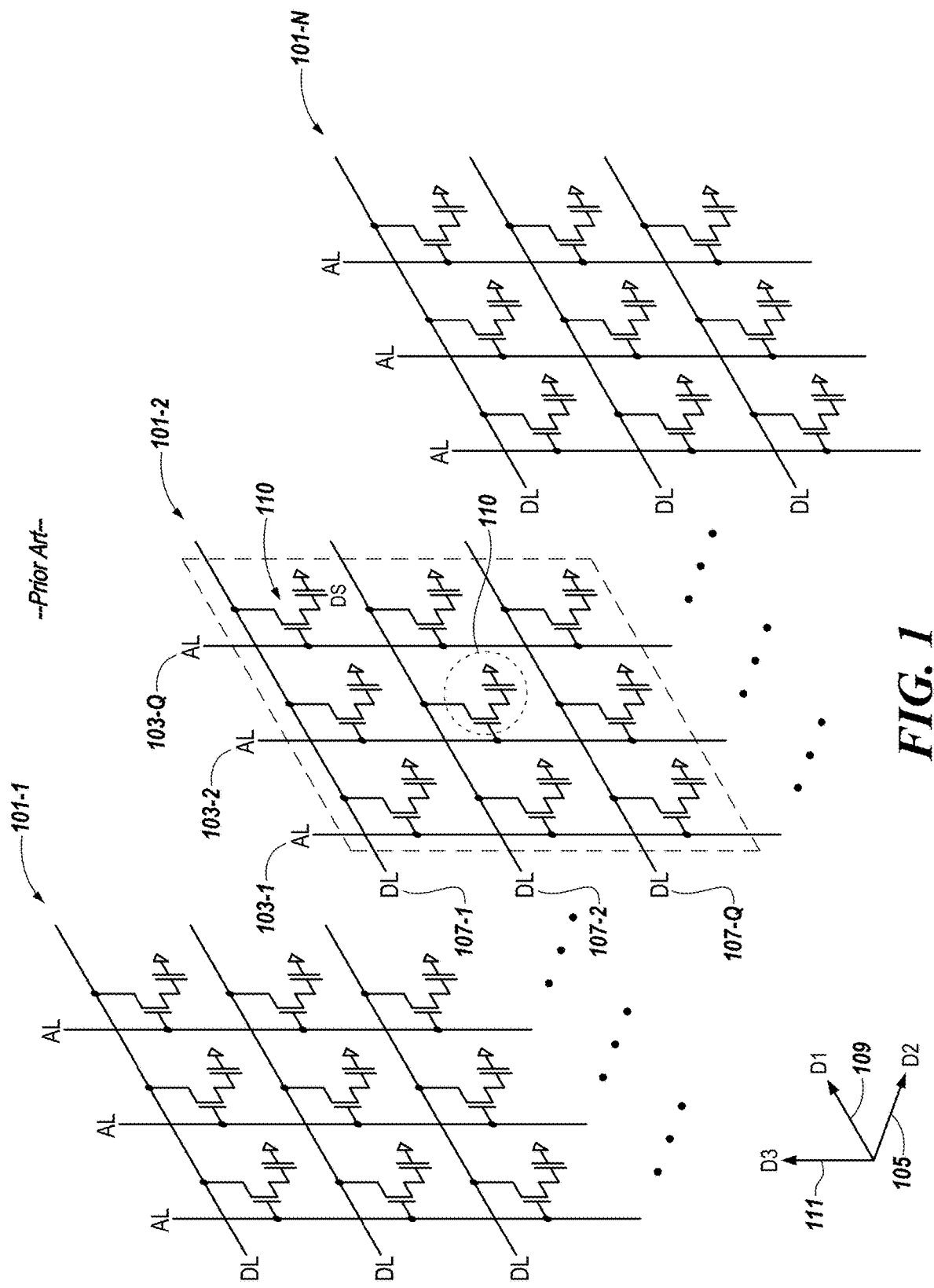
FIG. 1. is a schematic illustration of a vertical three dimensional (3D) memory device in accordance with a number of embodiments of the present disclosure.

Embodiments of the present disclosure describe widened conductive line structures and staircase structures for semiconductor devices. Semiconductor memory devices may include vertical stacks, each vertical stack including layers of semiconductor and dielectric materials. Conductive lines may be formed within one or more dielectric material layers.

In some instances, it may be useful to form one or more conductive line contacts to connect conductive lines of one tier of a vertical stack to sense amplifiers or other circuitry (e.g., word line drivers). However, this requires a great deal of precision, time, and resources, since the conductive line contacts must make contact with the conductive lines that have relatively small widths, leaving a very little margin of error.

The embodiments of the present disclosure include methods and apparatuses for forming wider conductive lines creating layers of conductive material to serve as interconnections between a conductive line and a conductive line contact. Embodiments of the present disclosure provide a greater area on which a conductive line contact may be formed. Therefore, some advantages of the embodiments described herein include reduced precision, time, and resources required to form conductive line contacts, among other advantages.

The figures herein follow a numbering convention in which the first digit or digits correspond to the figure number of the drawing and the remaining digits identify an element or component in the drawing. Similar elements or components between different figures may be identified by the use of similar digits. For example, reference numeral 107 may reference element "07" in FIG. 1, and a similar element may be referenced as 207 in FIG. 2. Multiple analogous elements within one figure may be referenced with a reference numeral followed by a hyphen and another numeral or a letter. For example, 607-1 may reference element 607-1 in FIGS. 3 and 607-2 may reference element 607-2, which may be analogous to element 607-1. Such analogous elements may be generally referenced without the hyphen and extra numeral or letter. For example, elements 607-1 and 607-2 or other analogous elements may be generally referenced as 607. The use of a letter, such as 607-N, is used to illustrate that in an embodiment shown in a particular figure, any number of items 607 may be utilized.

FIG. 1 is a block diagram of an apparatus in accordance with a number of embodiments of the present disclosure. FIG. 1 illustrates a circuit diagram showing a cell array of a three dimensional (3D) semiconductor memory device according to embodiments of the present disclosure. FIG. 1 illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays (e.g., sub cell array 101-2) may include a plurality of access lines 103-1, 103-2, . . . , 103-Q (which also may be referred to as word lines). Also, each of the sub cell arrays (e.g., sub cell array 101-2) may include a plurality of digit lines 107-1, 107-2, . . . , 107-Q (which also may be referred to as bitlines, data lines, or sense lines). In FIG. 1, the digit lines 107-1, 107-2, . . . , 107-Q are illustrated extending in a first direction (D1) 109 and the access lines 103-1, 103-2, . . . , 103-Q are illustrated extending in a third direction (D3) 111.

The first direction (D1) 109 and the second direction (D2) 105 may be considered in a horizontal ("X-Y") plane. The third direction (D3) 111 may be considered in a vertical ("Z") direction (e.g., transverse to the X-Y plane). Hence, according to embodiments described herein, the access lines 103-1, 103-2, . . . , 103-Q are extending in a vertical direction (e.g., third direction (D3) 111).

A memory cell (e.g., 110) may include an access device (e.g., access transistor) and a storage node located at an intersection of each access line 103-1, 103-2, . . . , 103-Q and each digit line 107-1, 107-2, . . . , 107-Q. Memory cells may be written to, or read from, using the access lines 103-1, 103-2, . . . , 103-Q and digit lines 107-1, 107-2, . . . , 107-Q. The digit lines 107-1, 107-2, . . . , 107-Q may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-1, 101-2, . . . , 101-N. One memory cell, e.g., 110, may be located between one access line (e.g., 103-2) and one digit line (e.g., 107-2). Each memory cell may be uniquely addressed through a combination of an access line 103-1, 103-2, . . . , 103-Q and a digit line 107-1, 107-2, . . . , 107-Q.

The digit lines 107-1, 107-2, . . . , 107-Q may be or include conducting patterns (e.g., metal lines) disposed on and spaced apart from a substrate. The digit lines 107-1, 107-2, . . . , 107-Q may extend in a first direction (D1) 109. The digit lines 107-1, 107-2, . . . , 107-Q in one sub cell array (e.g., 101-2) may be spaced apart from each other in a vertical direction (e.g., in a third direction (D3) 111).

The access lines 103-1, 103-2, . . . , 103-Q may be or include conductive patterns (e.g., metal lines) extending in a vertical direction with respect to the substrate (e.g., in a third direction (D3) 111). The access lines in one sub cell array (e.g., 101-2) may be spaced apart from each other in the first direction (D1) 109.

A gate of a memory cell (e.g., memory cell 110) may be connected to an access line (e.g., 103-2) and a first conductive node (e.g., first source/drain region) of an access device (e.g., transistor) of the memory cell 110 may be connected to a digit line (e.g., 107-2). Each of the memory cells (e.g., memory cell 110) may be connected to a storage node (e.g., capacitor). A second conductive node (e.g., second source/drain region) of the access device (e.g., transistor) of the memory cell 110 may be connected to the storage node (e.g., capacitor).

Storage nodes, such as capacitors, can be formed from ferroelectric and/or dielectric materials such as zirconium oxide ($ZrO_2$), hafnium oxide ($HfO_2$) oxide, lanthanum oxide ($La_2O_3$), lead zirconate titanate (PZT, $Pb[Zr(x)Ti(1-x)]O_3$), barium titanate ($BaTiO_3$), aluminum oxide (e.g., $Al_2O_3$), a combination of these with or without dopants, or other suitable materials.

While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line (e.g., 107-2) and the other may be connected to a storage node.

Figure 2:
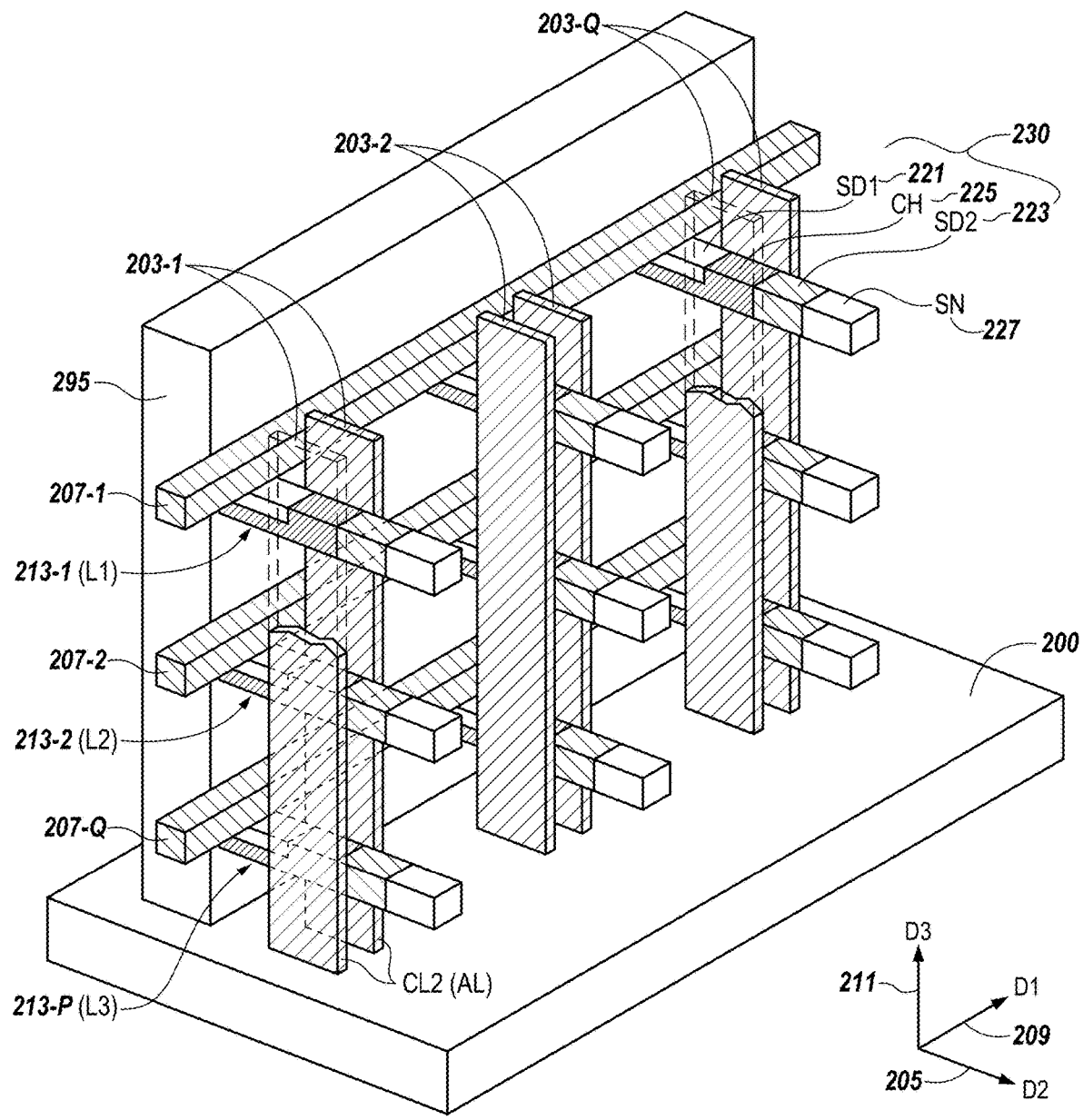
FIG. 2 is a perspective view illustrating a portion of a conductive line and staircase contact for semiconductor devices in accordance with a number of embodiments of the present disclosure.
Figure 3:
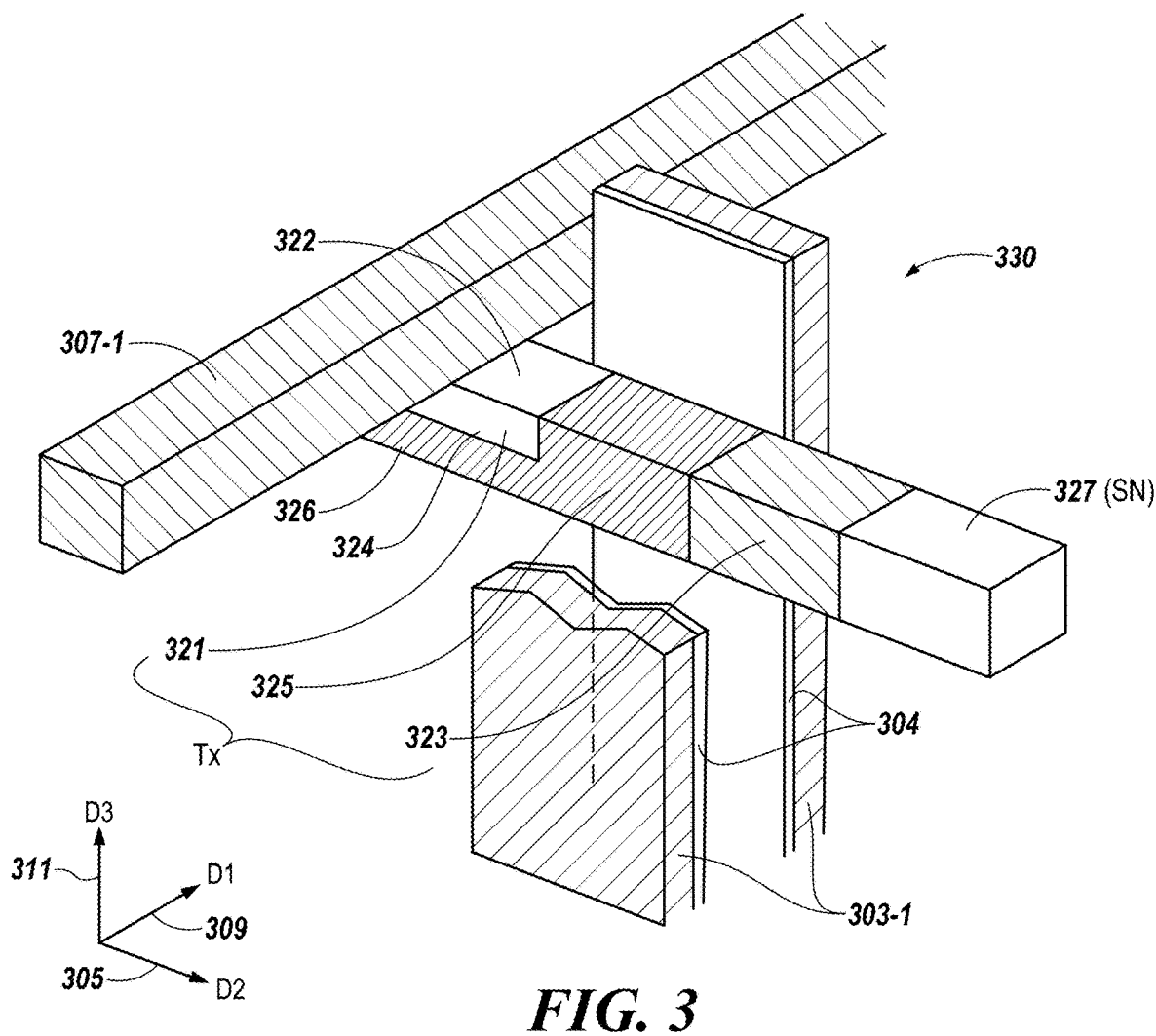
FIG. 3 is a perspective view illustrating a portion of a conductive line and staircase contact for semiconductor devices in accordance with a number of embodiments of the present disclosure.

FIG. 2 illustrates a perspective view showing a 3D semiconductor memory device (e.g., a portion of a sub cell array 101-2 shown in FIG. 1 as a vertically oriented stack of memory cells in an array) according to some embodiments of the present disclosure. FIG. 3 illustrates a perspective view showing unit cell (e.g., memory cell 110 shown in FIG. 1) of the 3D semiconductor memory device shown in FIG. 2.

As shown in FIG. 2, a substrate 200 may have formed thereon one of the plurality of sub cell arrays (e.g., 101-2) described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells (e.g., memory cell 110 in FIG. 1) extending in a vertical direction (e.g., third direction (D3) 111). According to some embodiments the vertically oriented stack of memory cells may be fabricated such that each memory cell (e.g., memory cell 110 in FIG. 1) is formed on plurality of vertical levels (e.g., a first level (L1), a second level (L2), and a third level (L3)). The repeating, vertical levels, L1, L2, and L3, may be arranged (e.g., "stacked") a vertical direction (e.g., third direction (D3) 111 shown in FIG. 1) and may be separated from the substrate 200 by an insulator material 220. Each of the repeating, vertical levels, L1, L2, and L3 may include a plurality of discrete components (e.g., regions) to the laterally oriented access devices 230 (e.g., transistors) and storage nodes (e.g., capacitors) including access line 103-1, 103-2, . . . , 103-Q connections and digit line 107-1, 107-2, . . . , 107-Q connections. The plurality of discrete components to the laterally oriented access devices 230 (e.g., transistors) may be formed in a plurality of iterations of vertically, repeating layers within each level and may extend horizontally in the second direction (D2) 205, analogous to second direction (D2) 105 shown in FIG. 1.

The plurality of discrete components to the laterally oriented access devices 230 (e.g., transistors) may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 227 (e.g., capacitor) may be connected to one respective end of the access device. As shown in FIG. 2, the storage node 227 (e.g., capacitor) may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell (e.g., memory cell 110 in FIG. 1) may similarly extend in the second direction (D2) 205, analogous to second direction (D2) 105 shown in FIG. 1.

As shown in FIG. 2 a plurality of horizontally oriented digit lines 207-1, 207-2, . . . , 207-Q extend in the first direction (D1) 209, analogous to the first direction (D1) 109 in FIG. 1. The plurality of horizontally oriented digit lines 207-1, 207-2, . . . , 207-Q may be analogous to the digit lines 107-1, 107-2, . . . , 107-Q shown in FIG. 1. The plurality of horizontally oriented digit lines 207-1, 207-2, . . . , 207-Q may be arranged (e.g., "stacked") along the third direction (D3) 211. The plurality of horizontally oriented digit lines 207-1, 207-2, . . . , 207-Q may include a conductive material. For example, the conductive material may include one or more of a doped semiconductor (e.g., doped silicon, doped germanium, etc.) a conductive metal nitride (e.g., titanium nitride, tantalum nitride, etc.) a metal (e.g., tungsten (W), titanium (Ti), tantalum (Ta), ruthenium (Ru), cobalt (Co), molybdenum (Mo), etc.) and/or a metal-semiconductor compound (e.g., tungsten silicide, cobalt silicide, titanium silicide, etc.) Embodiments, however, are not limited to these examples.

Among each of the vertical levels, (L1) 213-1, (L2) 213-2, and (L3) 213-P, the horizontally oriented memory cells (e.g., memory cell 110 in FIG. 1) may be spaced apart from one another horizontally in the first direction (D1) 209. However, as described in more detail below in connection with FIG. 4A, et seq., the plurality of discrete components to the laterally oriented access devices 230 (e.g., first source/drain region 221 and second source/drain region 223 separated by a channel region 225), extending laterally in the second direction (D2) 205, and the plurality of horizontally oriented digit lines 207-1, 207-2, . . . , 207-Q, extending laterally in the first direction (D1) 209, may be formed within different vertical layers within each level. For example, the plurality of horizontally oriented digit lines 207-1, 207-2, . . . , 207-Q, extending in the first direction (D1) 209, may be disposed on, and in electrical contact with, top surfaces of first source/drain regions 221 and orthogonal to laterally oriented access devices 230 (e.g., transistors) extending laterally in the second direction (D2) 205. In some embodiments, the plurality of horizontally oriented digit lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/drain region 221 and second source/drain region 223 separated by a channel region 225) of the laterally oriented access device are formed. In some embodiments, the plurality of horizontally oriented digit lines 207-1, 207-2, . . . , 207-Q, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200 (e.g., in a third direction (D3) 211). Further, as shown in FIG. 2, the access lines, 203-1, 203-2, . . . , 203-Q, in one sub cell array (e.g., sub cell array 101-2 in FIG. 1) may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230 (e.g., transistors) extending laterally in the second direction (D2) 205, but adjacent to each other on a level (e.g., first level (L1)) in the first direction (D1) 209. Each of the access lines, 203-1, 203-2, . . . , 203-Q, may vertically extend, in the third direction (D3), on sidewalls of respective ones of the plurality of laterally oriented access devices 230 (e.g., transistors) that are vertically stacked.

For example, and as shown in more detail in FIG. 3, a first one of the vertically extending access lines (e.g., 203-1) may be adjacent a sidewall of a channel region 225 to a first one of the laterally oriented access devices 230 (e.g., transistors) in the first level (L1) 213-1, a sidewall of a channel region 225 of a first one of the laterally oriented access devices 230 (e.g., transistors) in the second level (L2) 213-2, and a sidewall of a channel region 225 a first one of the laterally oriented access devices 230 (e.g., transistors) in the third level (L3) 213-P, etc. Similarly, a second one of the vertically extending access lines (e.g., 203-2) may be adjacent a sidewall to a channel region 225 of a second one of the laterally oriented access devices 230 (e.g., transistors) in the first level (L1) 213-1, spaced apart from the first one of laterally oriented access devices 230 (e.g., transistors) in the first level (L1) 213-1 in the first direction (D1) 209. And the second one of the vertically extending access lines (e.g., 203-2) may be adjacent a sidewall of a channel region 225 of a second one of the laterally oriented access devices 230 (e.g., transistors) in the second level (L2) 213-2, and a sidewall of a channel region 225 of a second one of the laterally oriented access devices 230 (e.g., transistors) in the third level (L3) 213-P, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 1.

As shown in the example embodiment of FIG. 2, a conductive body contact 295 may be formed extending in the first direction (D1) 209 along an end surface of the laterally oriented access devices 230 (e.g., transistors) in each level (L1) 213-1, (L2) 213-2, and (L3) 213-P above the substrate 200. The body contact 295 may be connected to a body, as shown by 336 in FIG. 3, (e.g., body region) of the laterally oriented access devices 230 (e.g., transistors) in each memory cell (e.g., memory cell 110 in FIG. 1). The body contact 295 may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell (e.g., memory cell 110 in FIG. 1) of the vertically stacked array of memory cells (e.g., within a sub cell array 101-2 in FIG. 1) according to some embodiments of the present disclosure. As shown in FIG. 3, the first and the second source/drain regions, 321 and 323, may be impurity doped regions to the laterally oriented access devices 330 (e.g., transistors). The first and the second source/drain regions, 321 and 323, may be analogous to the first and the second source/drain regions 221 and 223 shown in FIG. 2. The first and the second source/drain regions may be separated by a channel 325 formed in a body of semiconductor material (e.g., body region 326) of the laterally oriented access devices 330 (e.g., transistors). The first and the second source/drain regions, 321 and 323, may be formed from an n-type or p-type dopant doped in the body region 326. Embodiments are not so limited.

For example, for an n-type conductivity transistor construction, the body region 326 of the laterally oriented access devices 330 (e.g., transistors) may be formed of a low doped (p−) p-type semiconductor material. In some embodiments, the body region 326 and the channel 325 separating the first and the second source/drain regions, 321 and 323, may include a low doped, p-type (e.g., low dopant concentration (p−)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide (In2O3), or indium tin oxide (In2-xSnxO3), formed using an atomic layer deposition process, etc. Embodiments, however, are not limited to these examples.

As used herein, a degenerate semiconductor material is intended to mean a semiconductor material, such as polysilicon, containing a high level of doping with significant interaction between dopants (e.g., phosphorous (P), boron (B), etc.). Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the laterally oriented access devices 330 (e.g., transistors) may be of a p-type conductivity construction in which case the impurity (e.g., dopant) conductivity types would be reversed.

As shown in the example embodiment of FIG. 3, the first source/drain region 321 may occupy an upper portion in the body 326 of the laterally oriented access devices 330 (e.g., transistors). For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the laterally, horizontally oriented transistor 330 may have a body portion 326 which is below the first source/drain region 321 and is in electrical contact with the body contact (e.g., 295 shown in FIG. 2). Further, as shown in the example embodiment of FIG. 3, a digit line (e.g., 307-1) analogous to the digit lines 207-1, 207-2, . . . , 207-Q in FIGS. 2 and 107-1, 107-2, . . . , 107-Q shown in FIG. 1, may disposed on a top surface 322 of the first source/drain region 321 and electrically coupled thereto.

As shown in the example embodiment of FIG. 3, an access line (e.g., 303-1 analogous to the access lines 203-1, 203-2, . . . , 203-Q in FIGS. 2 and 103-1, 103-2, . . . , 103-Q in FIG. 1) may be vertically extending in the third direction (D3) 311 adjacent sidewall of the channel region 325 portion of the body 326 to the laterally oriented access devices 330 (e.g., transistors) horizontally conducting between the first and the second source/drain regions 321 and 323 along the second direction (D2) 305. A gate dielectric material 304 may be interposed between the access line 303-1 (a portion thereof forming a gate to the laterally oriented access devices 330 (e.g., transistors) and the channel region 325.

The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
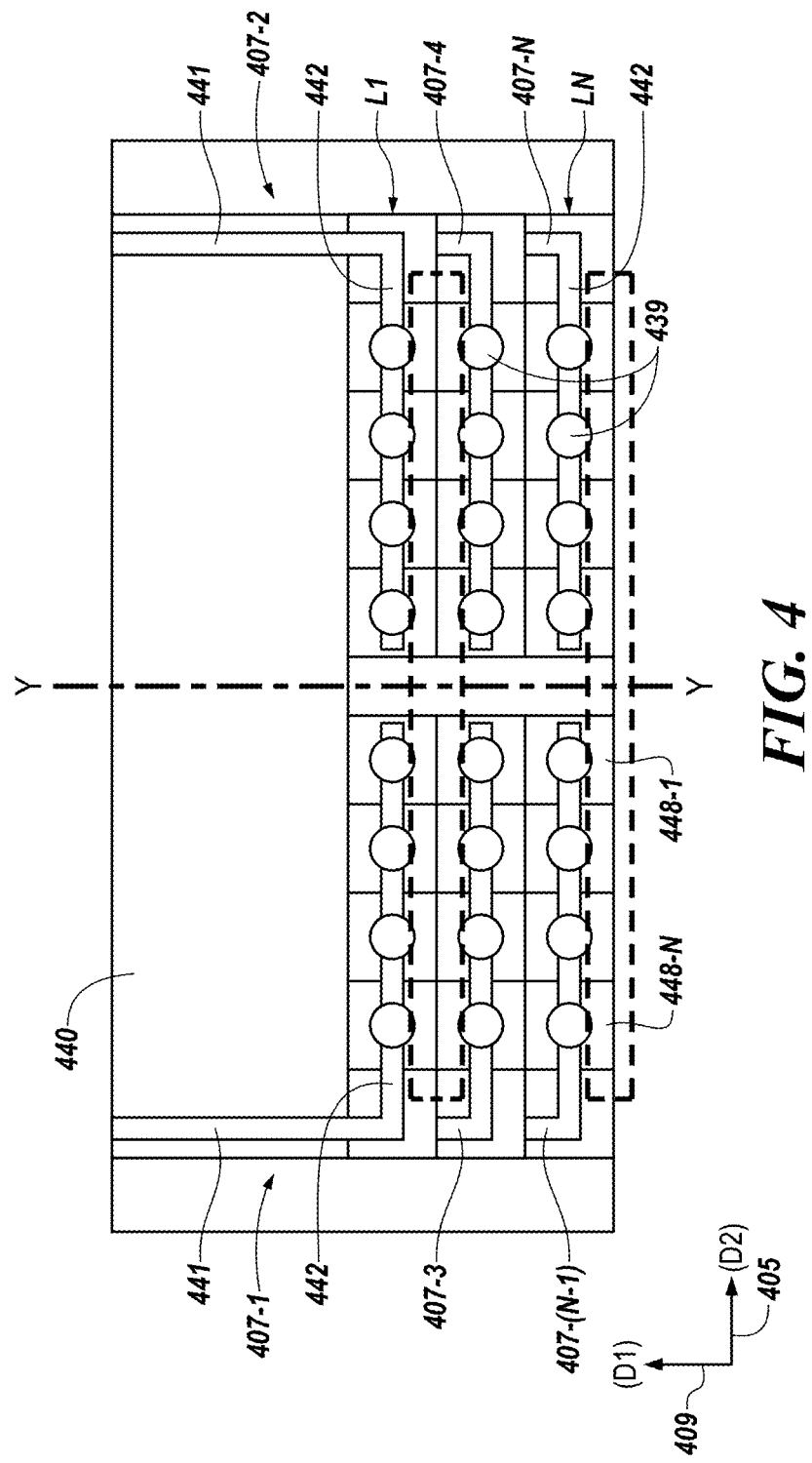
FIG. 4 is an overhead view of a conductive line and staircase structure in accordance with one or more embodiments of the present disclosure.

FIG. 4 is an overhead view of a conductive line and staircase structure in accordance with one or more embodiments of the present disclosure. A memory device may include a 3D array of vertically stacked memory cells 440 (i.e., a memory cell array). The 3D array 440 of vertically stacked memory cells may include a vertical stack of horizontally oriented conductive lines (e.g., 407-1, . . . , 407-N). Each conductive line 407-1, . . . , 407-N formed within the array 440 may include a first portion 441 extending in a first horizontal direction (D1) 409. Each conductive line 407 may further include a second portion 442 extending in a second horizontal direction D2, at an angle to the first horizontal direction (D1) 409. In other words, the memory cell array 440 may include a number of multi-direction conductive lines 407 (also referred to as bent conductive lines or bent access lines).

For example, as shown in FIG. 4, in some embodiments, the second portion 442 of each conductive line 407 may extend in a second horizontal direction (D2) 405 at an angle to the first portion (e.g., perpendicular to the first horizontal direction (D1) 409).

As shown in FIG. 4, the 3D vertical array 440 may include a plurality of vertical levels L1 LN of the staircase contact decreasing in vertical height along the first direction 409 (D1). Levels L1, . . . LN may also be referred to as a plurality of groups of layers. Each vertical level may include one or more layers with one or more conductive lines 407 formed therein. In some embodiments, the lengths of the first portions 441 of the conductive lines 407 may descend from the top of the 3D vertical array 440 to the bottom. Thus, if the 3D array is comprised of levels L1, L2, . . . , LN and L1 is the top level of the vertical stack, the lengths of the first portions 441 of conductive lines 407 may descend from L1 to LN.

As shown in FIG. 4, the 3D vertical array 440 may include a plurality of tiers 448-1, . . . , 448-N decreasing in vertical height along the second direction 405 (D2) from a portion 441 to a reference line Y. Each tier 448-1, . . . , 448-N may include one or more layers with one or more conductive lines 407 formed therein. In some embodiments, the lengths of the second portions 442 of the conductive lines 407 may ascend from the bottom of the 3D vertical array 440 to the top. Thus, if the 3D array 440 is comprised of tiers 448-1, . . . , 448-N and 448-1 is at the top level of the vertical stack, the lengths of the second portions 442 of conductive lines 407 may ascend from 448-N to 448-1.

In some embodiments, the 3D memory array 440 may be symmetrical about reference line Y with regard to the lengths of conductive lines 407 portions 441 and 442. For example, portions 441 on the left side of reference line Y and 441 on the right side of reference line Y may be of equivalent lengths.

In some embodiments, it may be desirable to form vertical conductive line contacts 439 to connect conductive lines 407 of one tier 448 (e.g., 448-1). However, small conductive line widths can make this task difficult, since a great deal of precision is required to create a contact 439. Thus, wider conductive line portions 442 may be desirable.

Figure 5:
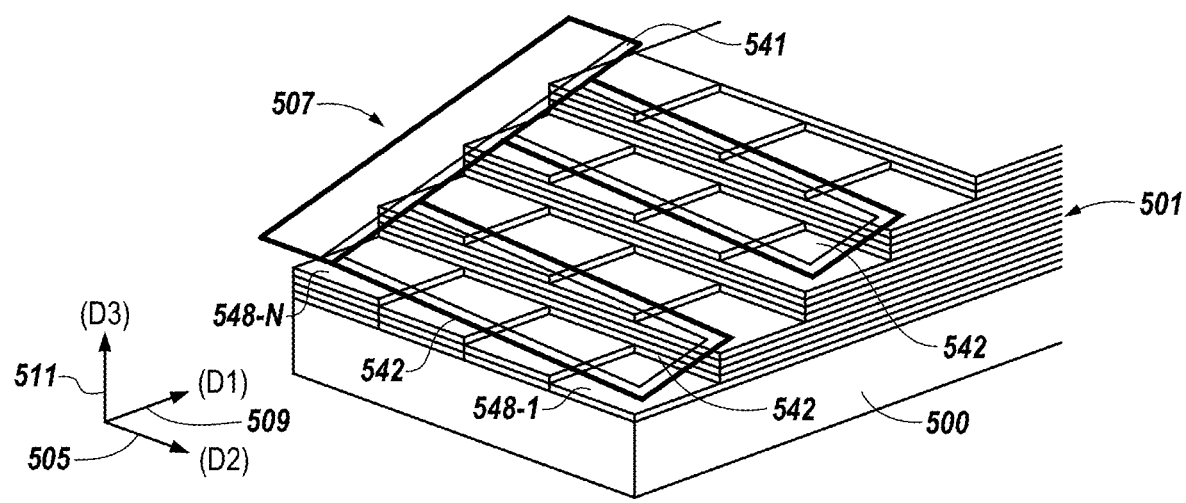
FIG. 5 is a perspective view of a widened conductive line and staircase structure in accordance with one or more embodiments of the present disclosure.

FIG. 5. is a perspective view of a widened conductive line and staircase structure in accordance with one or more embodiments of the present disclosure. A widened conductive line and staircase structure includes a substrate 500. The substrate 500 may be or include, for example, a silicon substrate, a germanium substrate, or a silicon-germanium substrate, etc. Embodiments, however, are not limited to these examples.

A staircase contact structure 501 is formed on a working surface of the substrate 500. The staircase contact structure 501 may include, for example, alternating layers of a first dielectric material, a semiconductor material, and a second dielectric material in repeating iterations. The staircase contact structure 501 may be a contact to one or more conductive lines, such as conductive line 507. Each conductive line 507 includes a portion 541 extending in a first horizontal direction 509. Each conductive line 507 also includes one or more portions 542 extending in a second horizontal direction 505. The second horizontal direction 505 may be, for example, perpendicular to the first horizontal direction 509. Portions 542 may be wider than portion 541. As shown in FIG. 5, staircase contact structure 501 may include a number of tiers 548-1, . . . , 548-N descending in vertical height from a digit line portion 541 and along the second direction 505. For example, tier 548-N may be of a greater height than tier 548-1. In accordance with embodiments of the present disclosure, contacts may be formed to connect each portion 542 at a different tier 548 of staircase contact structure 501.

As shown in FIG. 5, the staircase contact structure 501 may decrease in both vertical height, along the first horizontal direction 509, and also along the second horizontal direction 505, creating a staircase structure in the first horizontal direction 509 and a staircase structure in the second horizontal direction 505.

Figure 6:
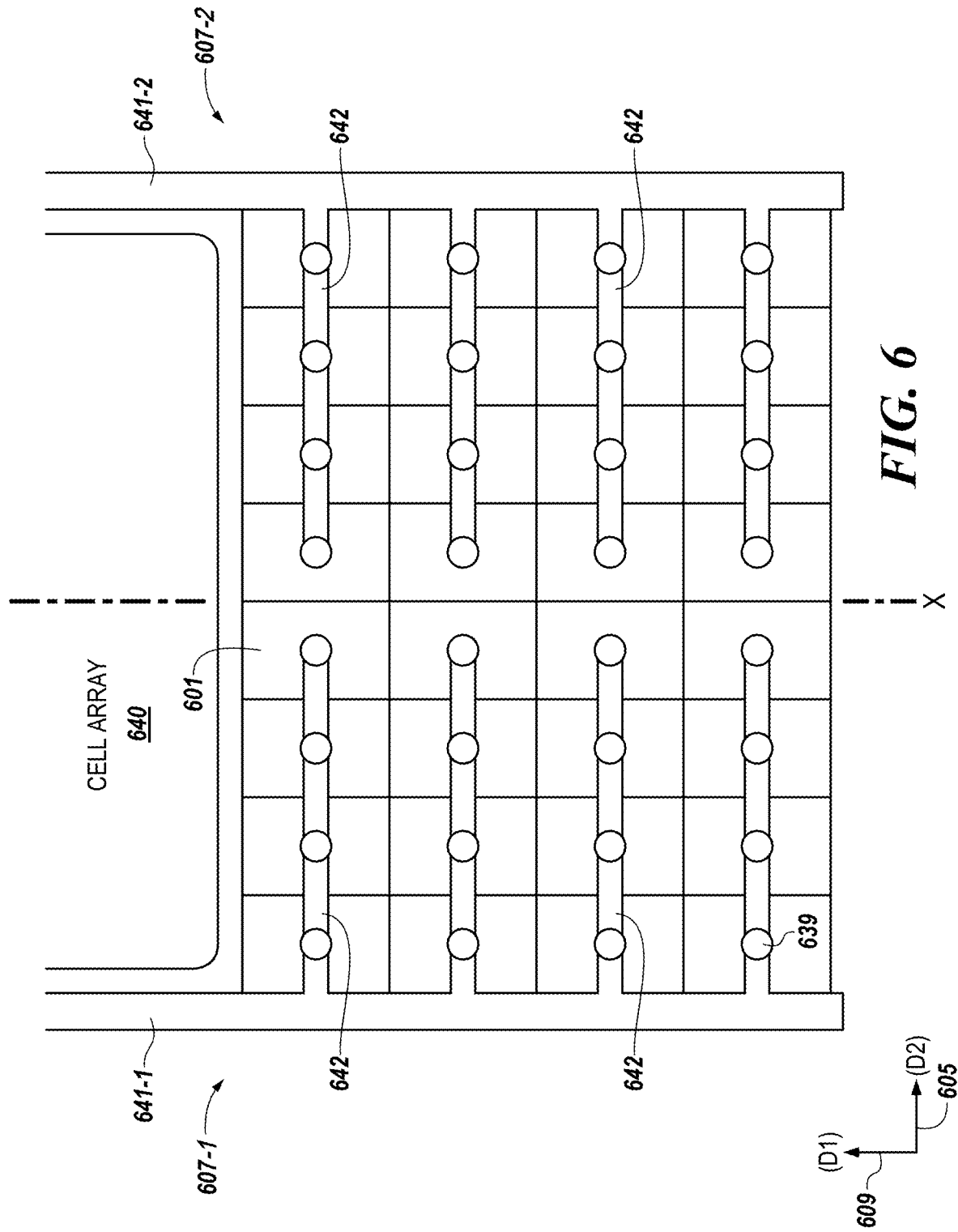
FIG. 6 is another overhead view of a conductive line and staircase structure in accordance with one or more embodiments of the present disclosure.

FIG. 6 is an overhead view of a conductive line and staircase structure in accordance with one or more embodiments of the present disclosure. As shown in FIG. 6, a memory cell array 640 may be coupled to one or more conductive lines 607 (e.g., 607-1 and 607-2). Although only two conductive lines 607-1 and 607-2 are shown in FIG. 6, embodiments of the present disclosure are not so limited. Each conductive line 607 may include a portion 641 extending in horizontal direction 609 and portions 642 extending in horizontal direction 605.

In some embodiments, it may be desirable to form one or more vertical contacts 639 between a conductive line 607 and a sense amplifier or other circuitry (e.g., word line driver). However, conventional conductive line widths require a high level of precision and a low margin of error. Thus, improved conductive line and staircase structures may be beneficial in some implementations.

Figure 7:
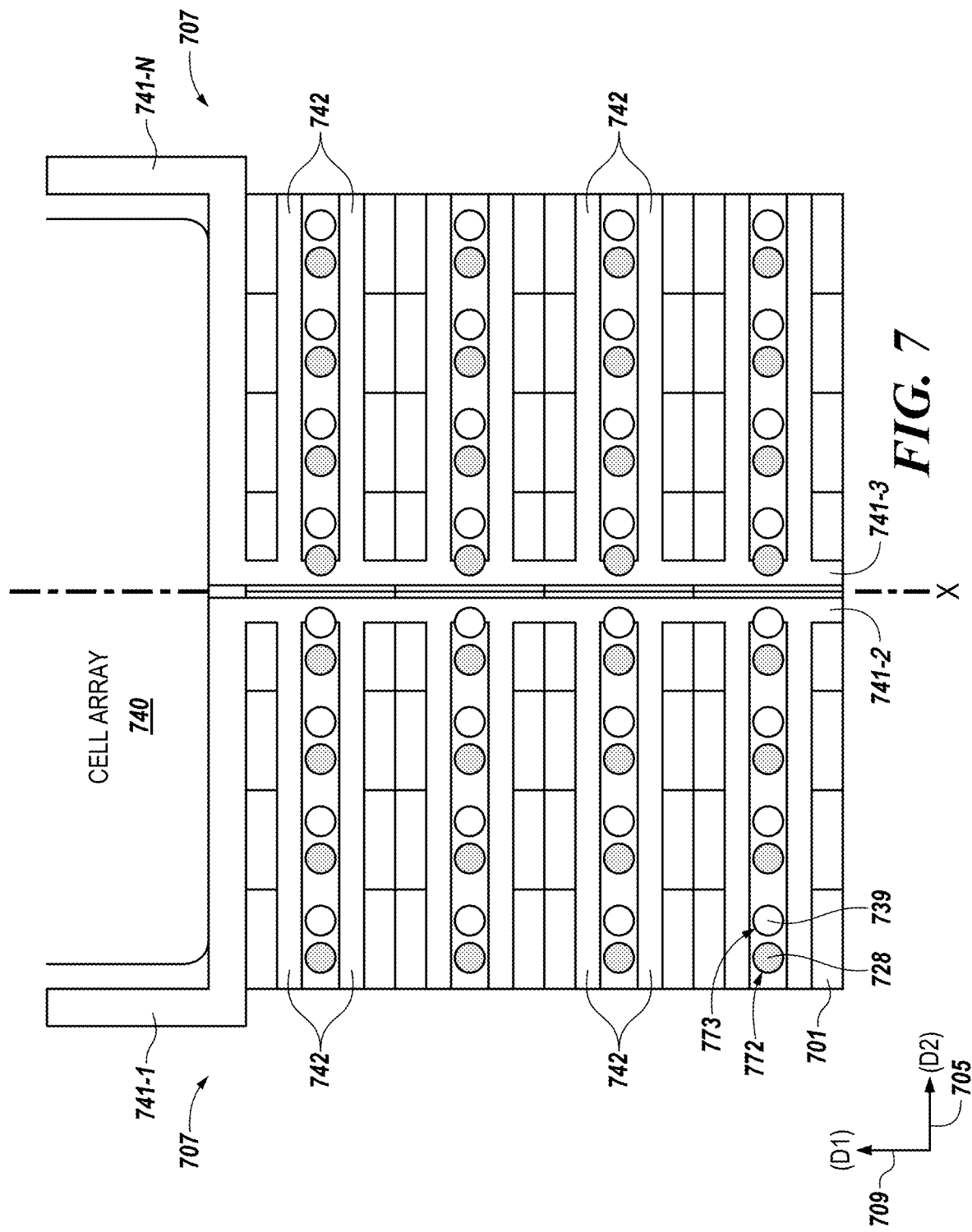
FIG. 7 is an overhead view of a widened conductive line and staircase structure in accordance with one or more embodiments of the present disclosure.

FIG. 7 is an overhead view of a widened conductive line and staircase structure in accordance with one or more embodiments of the present disclosure. As shown in FIG. 7, conductive lines 707 may be comprised of portions 741-1, . . . , 741-N extending in horizontal direction 709 and portions 742 extending in horizontal direction 705. Two portions (e.g., portions 741-2 and 741-3) may extend from a horizontal center line X of a memory cell array 740 above and along a staircase contact structure 701. The two portions 741-2 and 741-3 may be coupled to one or more portions 742.

Between two portions 742, one or more pad contact vias 772 may be formed. As will be described herein, the pad contact vias 772 may be vertically oriented and may intersect one or more layers of a dielectric material (e.g., dielectric material 1033 in FIG. 10B). Dielectric material of one or more layers may be removed through the pad contact vias 772, as described in connection with FIGS. 10C and 11C. Horizontally oriented conductive pads (e.g., conductive pads 1035 in FIG. 10E) may then be formed by depositing a conductive material into each of the horizontal openings once containing the dielectric material through the pad contact vias 772. Any excess conductive material remaining in the pad contact vias 772 may then be removed, and the pad contact vias may then be filled with a substrate dielectric material 728 to electrically isolate portions of the conductive pads.

A substrate dielectric material 728 may include any suitable type of dielectric material. Substrate contact dielectric material 728 may include, for example, a high-k dielectric material, a silicon oxide material, a silicon nitride material, a silicon oxynitride material, etc., or a combination thereof. Embodiments are not so limited. For example, in high-k dielectric material examples, the substrate dielectric material 728 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

The one or more pad contact vias 772 may extend to a substrate upon which the staircase contact structure 701 is formed (e.g., substrate 500 in FIG. 5). The substrate dielectric material 728 may be of the same material from which a substrate (e.g., substrate 500 in FIG. 5) is formed.

Conductive line contacts 739 may be also be formed between two portions 742. Although not shown in FIG. 7, the conductive line contacts 739 may allow for direct contact with conductive layers of the staircase contact structure 701, wherein the conductive layers are in direct, electric contact with conductive lines formed within the staircase contact structure 701. Thus, the conductive line contacts 739 may serve as contacts to the conductive lines 707.

Conductive line contacts may be formed from any conductive material. Conductive material may include, for example, a conductive polymer material. The conductive material may include one or more of a doped semiconductor (e.g., doped silicon, doped germanium, etc.) a conductive metal nitride (e.g., titanium nitride, tantalum nitride, etc.) a metal (e.g., tungsten (W), titanium (Ti), tantalum (Ta), ruthenium (Ru), cobalt (Co), molybdenum (Mo), etc.) and/or a metal-semiconductor compound (e.g., tungsten silicide, cobalt silicide, titanium silicide, etc.) Embodiments, however, are not limited to these examples. In some embodiments, the conductive line contacts 739 may form doped body contacts to conductive layers described in connection with FIGS. 9A-D, 10A-F, and 11A-E.

Figure 8A:
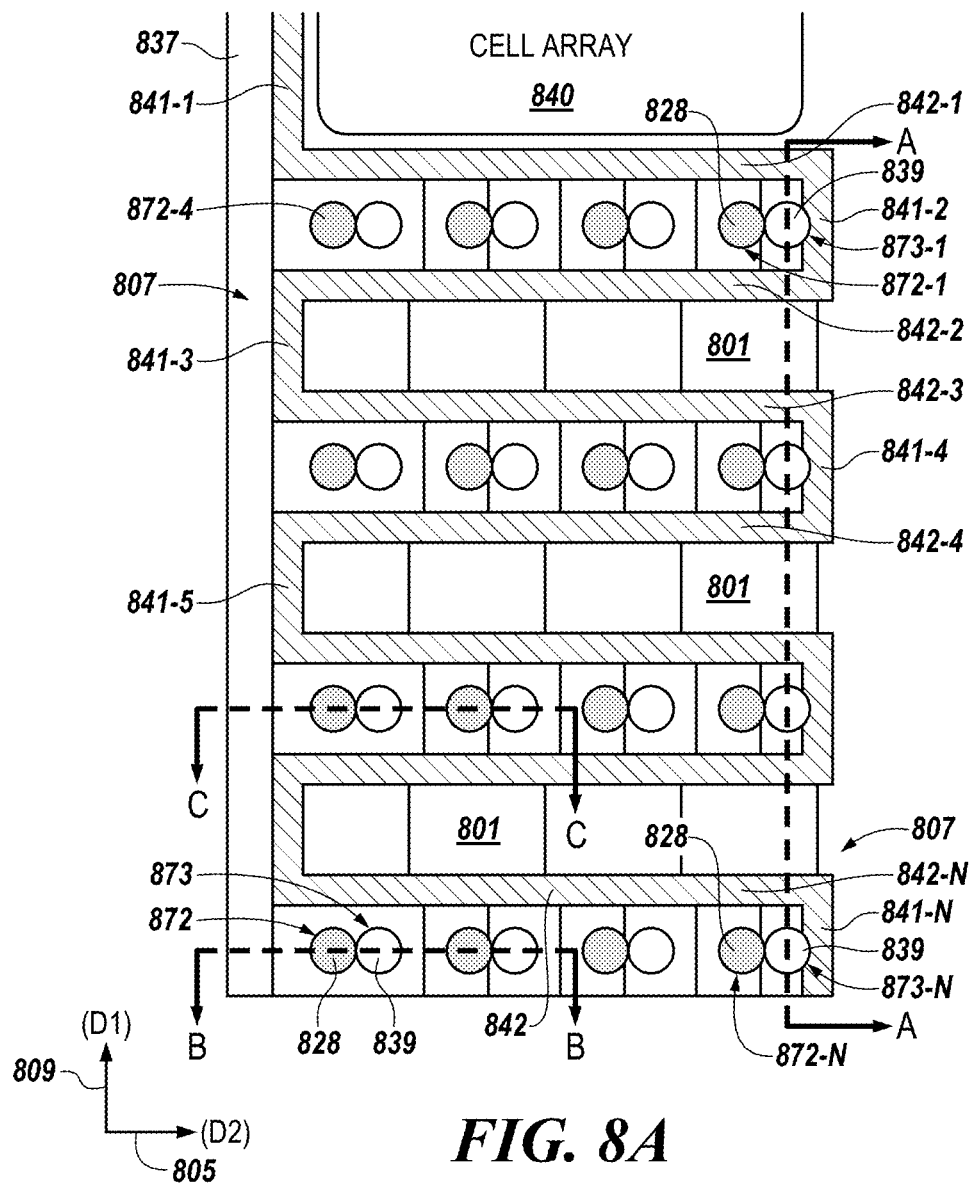
FIGS. 8A-D illustrate a method of forming a widened conductive line and staircase structure in accordance with one or more embodiments of the present disclosure.

FIGS. 8A-D illustrate a widened conductive line and staircase structure in accordance with one or more embodiments of the present disclosure. FIG. 8A is an overhead view of a widened conductive line and staircase structure in accordance with one or more embodiments of the present disclosure. As shown in FIG. 8A, a memory device may include a memory cell array 840.

The memory cell array 840 may be electrically coupled to at least one conductive line 807, the conductive line 807 extending along the perimeter of the memory cell array 840. Memory cell array 840 may include a staircase contact structure 801. Although not shown in FIG. 8A, the staircase contact structure 801 may be formed on a working surface of a substrate (e.g., substrate 800 shown in FIG. 8B). The staircase contact structure 801 allows for direct, electrical contact with conductive lines 807 via portions 842. Although not shown in FIG. 8A, a memory device in accordance with the present disclosure may include a stack of conductive lines 807, which each conductive line 807 is capable of being in direct, electrical contact (e.g., with sense amplifiers and other circuitry) via staircase contact structure 801.

Conductive line 807 may include portions 841-1, . . . , 841-N extending in a first horizontal direction 809 and portions 842 extending in a second horizontal direction 805. A dielectric 837 (e.g., a spin on dielectric) may be formed so as to make contact with conductive line 807 via staircase contact structure 801. For example, dielectric 837 may make contact with portions 841-1, 841-3, and 841-5 of conductive line 807.

A number of pad contact vias 872-1, . . . , 872-N may be formed. Each pad contact via 872-1, . . . , 872-N may be filled with a substrate dielectric 828. Although not shown in FIG. 8A, each pad contact via 872 may be designed to contact various levels of the vertical stack, down to as low a level as the substrate. The pad contact vias 872 may be positioned between two portions 842 of conductive line 807. For example, pad contact vias 872-1, . . . , 872-4 are positioned between portions 842-1 and 842-2.

A number of conductive line contact openings 873 may be formed. Each conductive line contact opening 873 may be formed adjacent to a pad contact via 872-1, . . . , 872-N. In some embodiments, each region between consecutive portions 842-1, . . . , 842-N (e.g. between 842-1 and 842-2) may contain a number of conductive line contact openings 873 equal to the number of pad contact vias 872-1, . . . , 872-N between portions consecutive portions 842-1, . . . , 842-N.

Figure 8B:
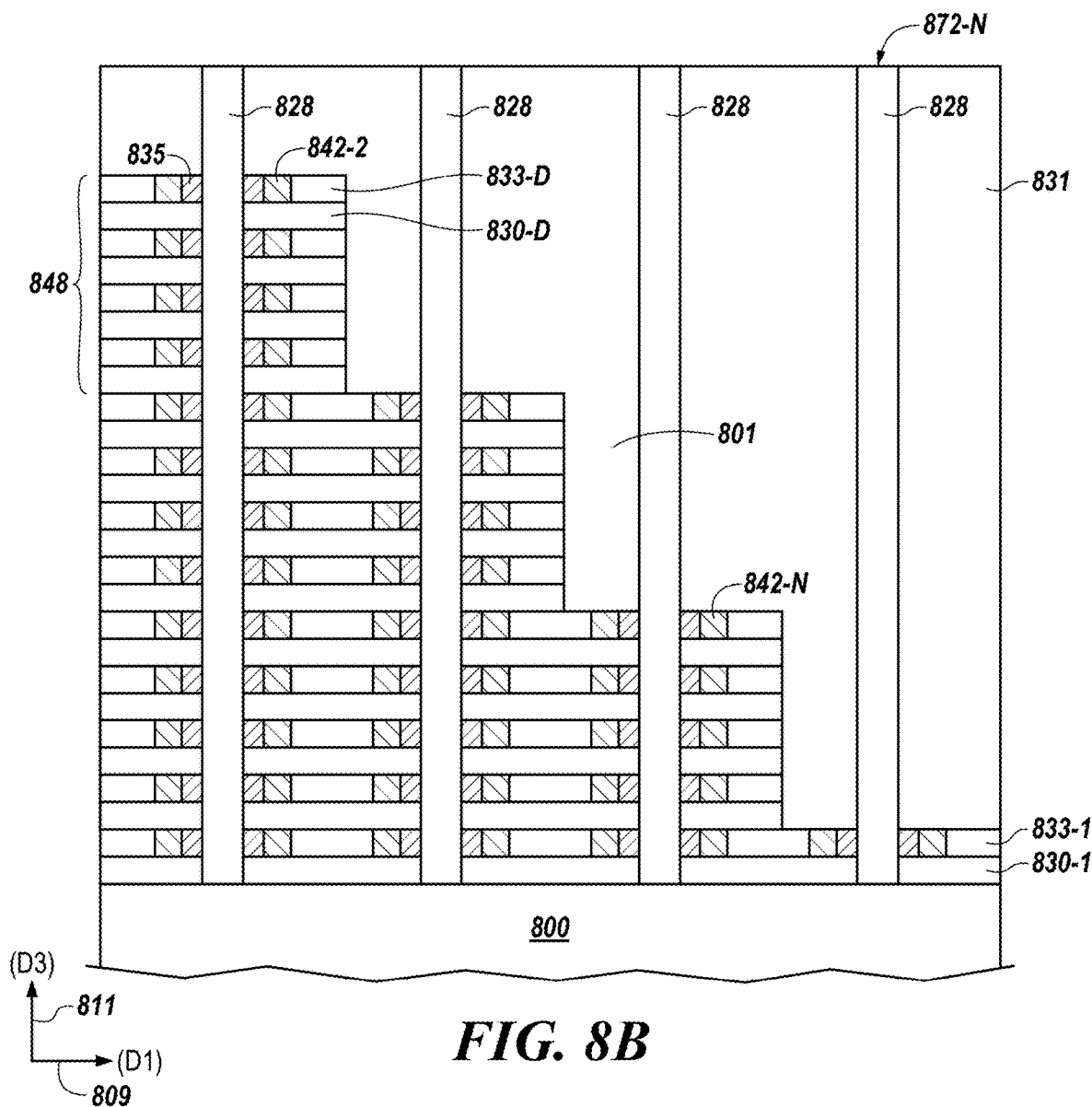

FIG. 8B is a cross-sectional view along line A in FIG. 8A. As shown in FIG. 8B, a staircase contact structure 801 is formed on a working surface of a substrate 800. The staircase contact structure 801 includes alternating layers of dielectric material 830 and dielectric material 833, with each dielectric material 833 having one or more conductive line portions 842-1, . . . , 842-N formed therein.

As illustrated in FIG. 8B, a staircase contact structure 801 may include alternating layers of a first dielectric material, 830-1, . . . , 830-D (collectively referred to as first dielectric material 830) and a second dielectric material, 833-1, . . . , 833-D (collectively referred to as second dielectric material 833), in repeating iterations to form a vertical stack on a working surface of a substrate 800, analogous to substrate 500 in FIG. 5.

In some embodiments, the first dielectric material may be an interlayer dielectric (ILD). By way of example, and not by way of limitation, the first dielectric material may include a silicon nitride ($Si_3N_4$) material (also referred to herein as "SiN"). In another example, the first dielectric material may include a silicon oxy-carbide material ($SiO_xN_y$) material (also referred to herein as "SiON"), and/or combinations thereof. Embodiments are not limited to these examples.

In some embodiments, the second dielectric material may be an interlayer dielectric (ILD). By way of example, and not by way of limitation, the second dielectric material may include a nitride material. The nitride material may be a silicon nitride ($Si_xN_y$) material (also referred to herein as ("SiN").

In another example, the second dielectric material 833 may include a silicon oxy-carbide (SiOC) material. In another example, the second dielectric material may include silicon oxy-nitride (SiON), and/or combinations thereof. Embodiments are not limited to these examples. However, according to some embodiments, the second dielectric material can be purposefully chosen to be different in material or composition than the first dielectric material, such that a selective etch process may be performed on one of the first and second dielectric layers, selective to the other one of the first and second dielectric layers, (e.g., the second SiN dielectric material may be selectively etched relative to a staircase dielectric 831).

The repeating iterations of alternating first dielectric material 830 layers and second dielectric material 833 layers may be formed according to a semiconductor fabrication process such as chemical vapor deposition (CVD) in a semiconductor fabrication apparatus. Embodiments, however, are not limited to this example, and other suitable fabrication techniques may be used to form the alternating layers of a first dielectric material, a semiconductor material, and a second dielectric material, in repeating iterations to form the staircase contact structure 801.

In the example of FIG. 8B, thirteen levels of the repeating iterations are shown. Embodiments, however, are not limited to this example, and more or fewer repeating iterations may be included.

In some embodiments, conductive lines 807 (i.e., portions 842-1, . . . , 842-N of conductive lines 807 in FIG. 8A) may be formed within the one or more layers of the second dielectric material 833-D of the staircase contact structure 801. This may be achieved through a conductive line formation process including, for example, forming a vertical opening, selectively removing the second dielectric 833 (e.g., via a lateral etch process through a vertical opening) to form a first horizontal opening by removing the second dielectric material 833 to a first distance back from a reference line (e.g., a center line in a vertical opening between one staircase contact structure and another staircase contact structure of the same semiconductor memory device).

The conductive line formation process may further include forming a conductive material into the vertical opening. In some embodiments, this may include conformally forming the conductive material into a portion of a vertical opening (e.g., using a chemical vapor deposition (CVD) process) such that the conductive material may also be formed into the first horizontal opening. In some embodiments, the conductive material may include a titanium nitride (TiN) material. The conductive material may form a horizontally (e.g., laterally) oriented conductive line.

Each pad contact via 872-1, . . . , 872-N may create an opening in staircase dielectric 831 through which one or more conductive pads 835 may be formed. Each pad contact via 872-1, . . . , 872-N also intersects one or more tiers 848 of staircase contact structure 801. After, the conductive pads 835 are formed, the substrate contact dielectric 828 may be formed through each of the pad contact vias 872-1, . . . , 872-N to provide electrical isolation between the tiers 848.

The conductive pads 835 are formed from a conductive material. The conductive material may include, for example, a conductive polymer material. In some embodiments, the conductive material may form a doped body contact to the pad contact vias 872-1, . . . , 872-N. Each conductive pad 835 may also be in direct, electrical contact with one or more conductive line portions 842-1, . . . , 842-N.

Figure 8C:
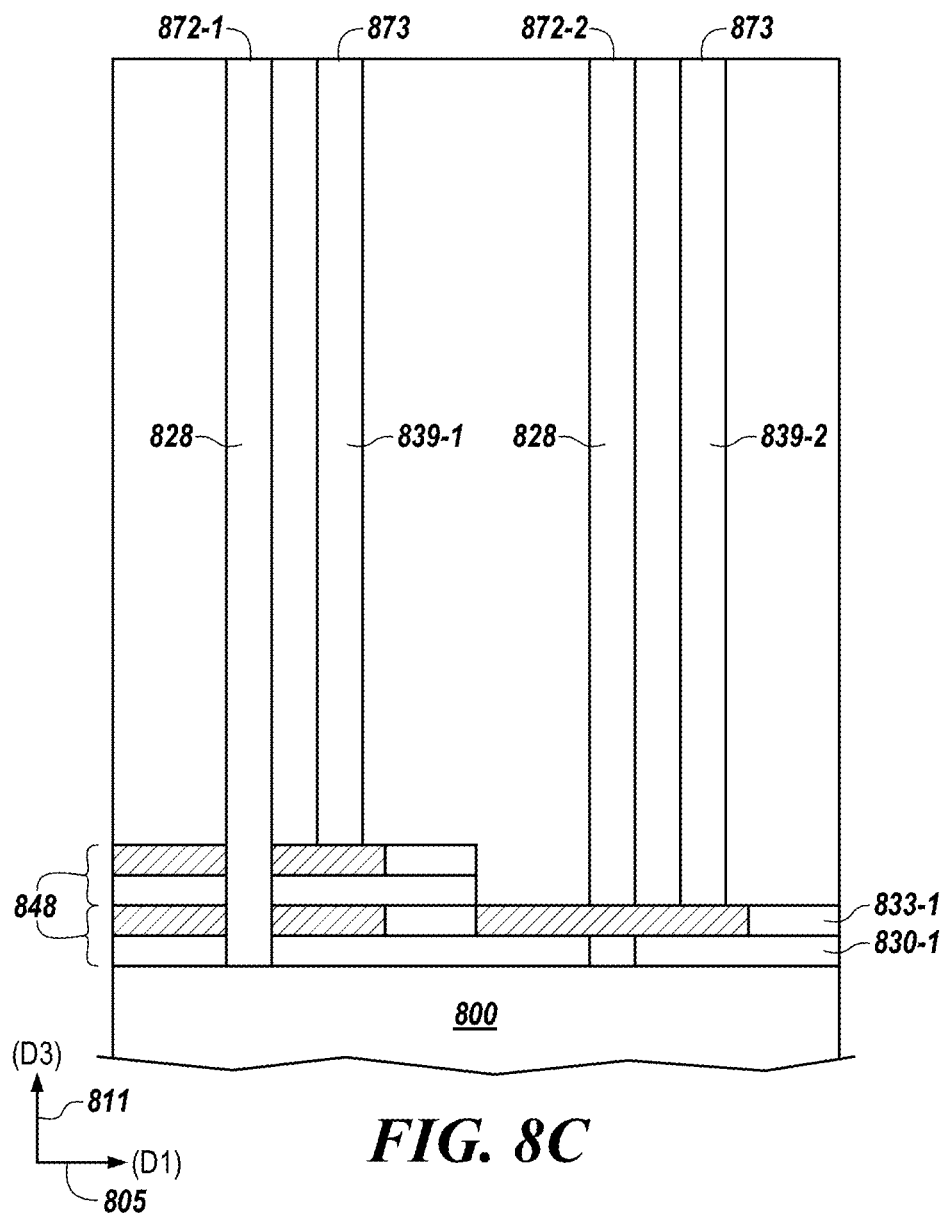

FIG. 8C is a cross-sectional view along line B. As shown in FIG. 8C, after the conductive pads 835 are formed, substrate dielectric 828 may be formed into one or more pad contact vias 872-1, 872-2. It should be noted that pad contact vias 872-1 and 872-2 of FIG. 8C are not necessarily equivalent in position to pad contact vias 872-1 and 872-2 of FIGS. 8A and 8B.

Although some pad contact vias 872-1, . . . , 872-N may intersect and form openings in conductive pads 835 (e.g., pad contact via 872-1), other pad contact vias 872-1, . . . , 872-N may conductive pads 835 intact and simply run adjacent (e.g., pad contact via 872-2) to each other.

One or more conductive line contacts 839-1 and 839-2 may be formed by forming a conductive material into each of the one or more conductive line contact openings 873. Unlike the pad contact vias 872-1 and 872-2, each of the conductive line contact openings 873 may be configured to make contact with a conductive pad 835 of a unique tier 848 of staircase contact structure 801.

Figure 8D:
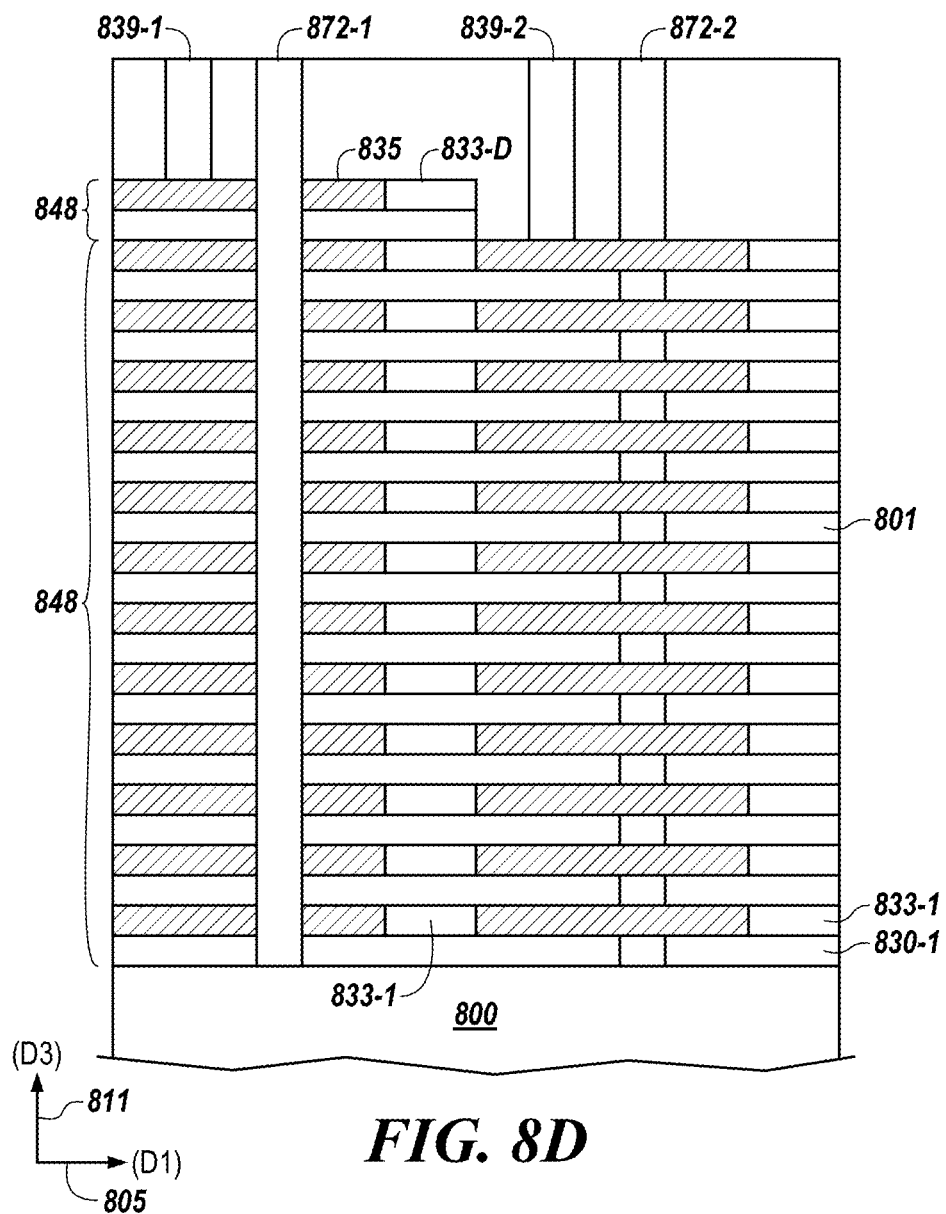

FIG. 8D is a cross-sectional view along line C. As shown in FIG. 8D, a staircase contact structure 801 may include more layers of dielectric material 833-1, . . . , 833-D with conductive contacts 835 formed therein. Layers of dielectric material 833-1, . . . , 833-D may be formed, for example, by removing a portion of a dielectric material 833 from layers of dielectric material 833-1, . . . , 833-N through a substrate contact opening 872-1 and forming a conductive pad 835 into a horizontal opening designated for that conductive pad 835, as shown in FIGS. 9A-D, FIGS. 10A-F, and FIGS. 11A-E.

Although FIG. 8D illustrates two conductive line contacts 839-1 and 839-2, embodiments of the present disclosure are not so limited and can include any number of conductive line contacts 839-1, . . . , 839-N. Conductive line contacts 839-1 and 839-2 may be formed in the same manner as described in connection with FIG. 8C, and each conductive line contact 839-N may be in direct, electrical contact with a conductive contact 835. In some embodiments, each conductive line contact 839-1 and 839-2 may be electrically coupled to a unique conductive pad 835, thereby forming the staircase contact structure.

Figure 9A:
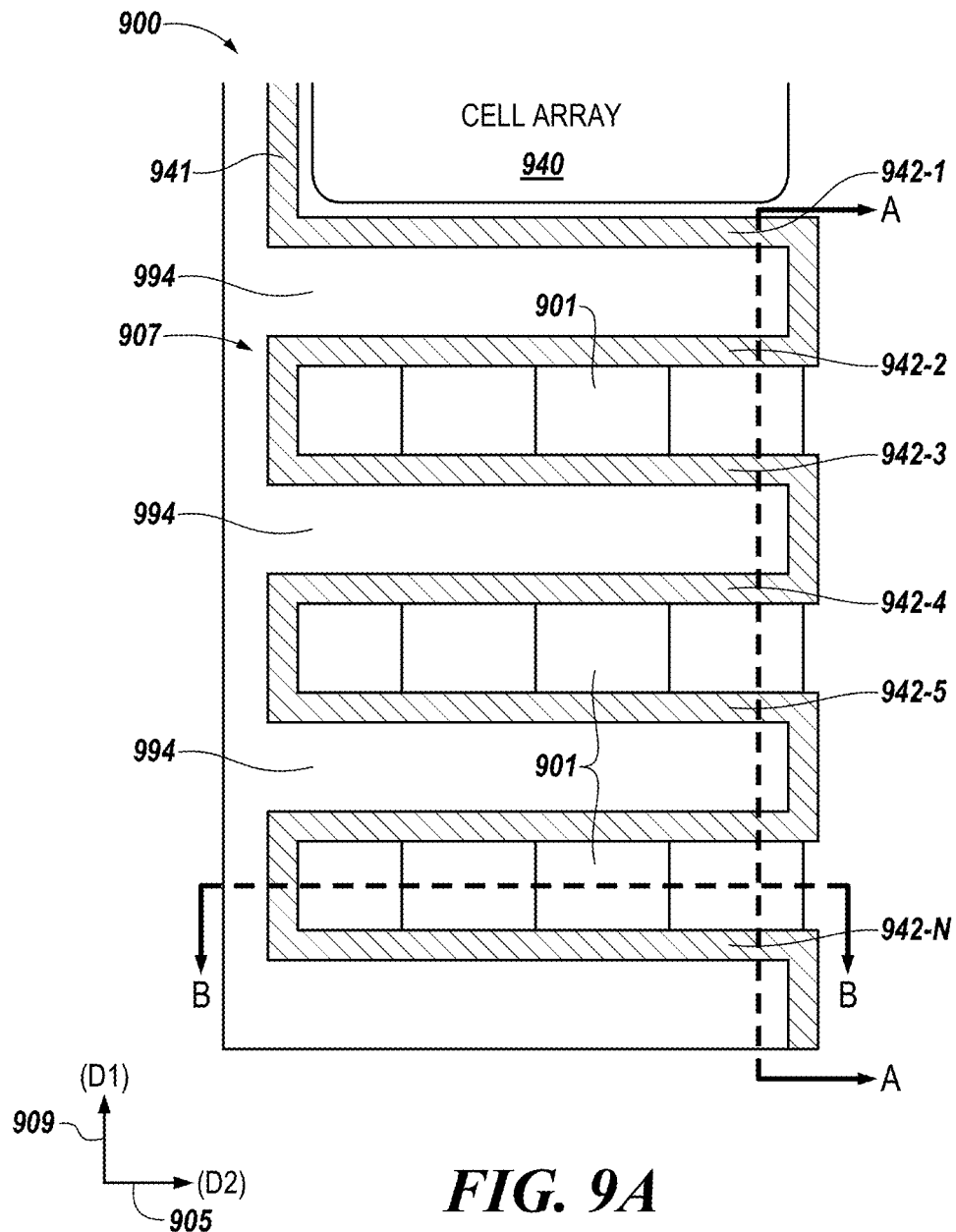
FIGS. 9A-E are an overhead view of a method of forming a widened conductive line and staircase structure in accordance with one or more embodiments of the present disclosure.

FIGS. 9A-E are an overhead view of a method of forming a widened conductive line and staircase structure in accordance with one or more embodiments of the present disclosure. FIG. 9A illustrates a first step of the method. As shown in FIG. 9A, a memory device 900 may include a memory cell array 940. The memory device 900 may include a conductive line 907, wherein at least a portion of the conductive line 907 extends along the perimeter of the memory cell array 940. Conductive line 907 includes portions 941 extending in a first horizontal direction 909 and portions 942 extending in a second horizontal direction 905. Memory device 900 may include a staircase contact structure 901 formed with portions 942 of the conductive lines 907.

A method of forming a widened conductive line and staircase structure in accordance with one or more embodiments of the present disclosure may include selectively removing material from a region 994. For example, although not shown in FIG. 9A, in some embodiments, a hard mask material (e.g., a photoresist layer) may be formed over region 994 of the staircase contact structure 901. In other embodiments, a hard mask material may be formed over a portion of the memory cell array 940. The hard mask material may serve to protect the memory cell array region 940 and portions of the staircase contact structure 901 during subsequent processing steps described below (e.g., staircase formation steps). In other words, the hard mask material may serve as a protective layer to keep the portions of the memory cell array 940 and staircase contact structure 901 that are not being removed intact during the removal process.

In some embodiments, a masking, patterning, and etching process can be used to open region 994 and form a widened conductive line and staircase structure as described below. Region 994 may include vertically stacked groups of layers. For example, region 994 may include vertically stacked groups of layers, where each group of layers includes a first dielectric material layer, and a second dielectric material layer with conductive lines 907 formed therein.

Figure 9B:
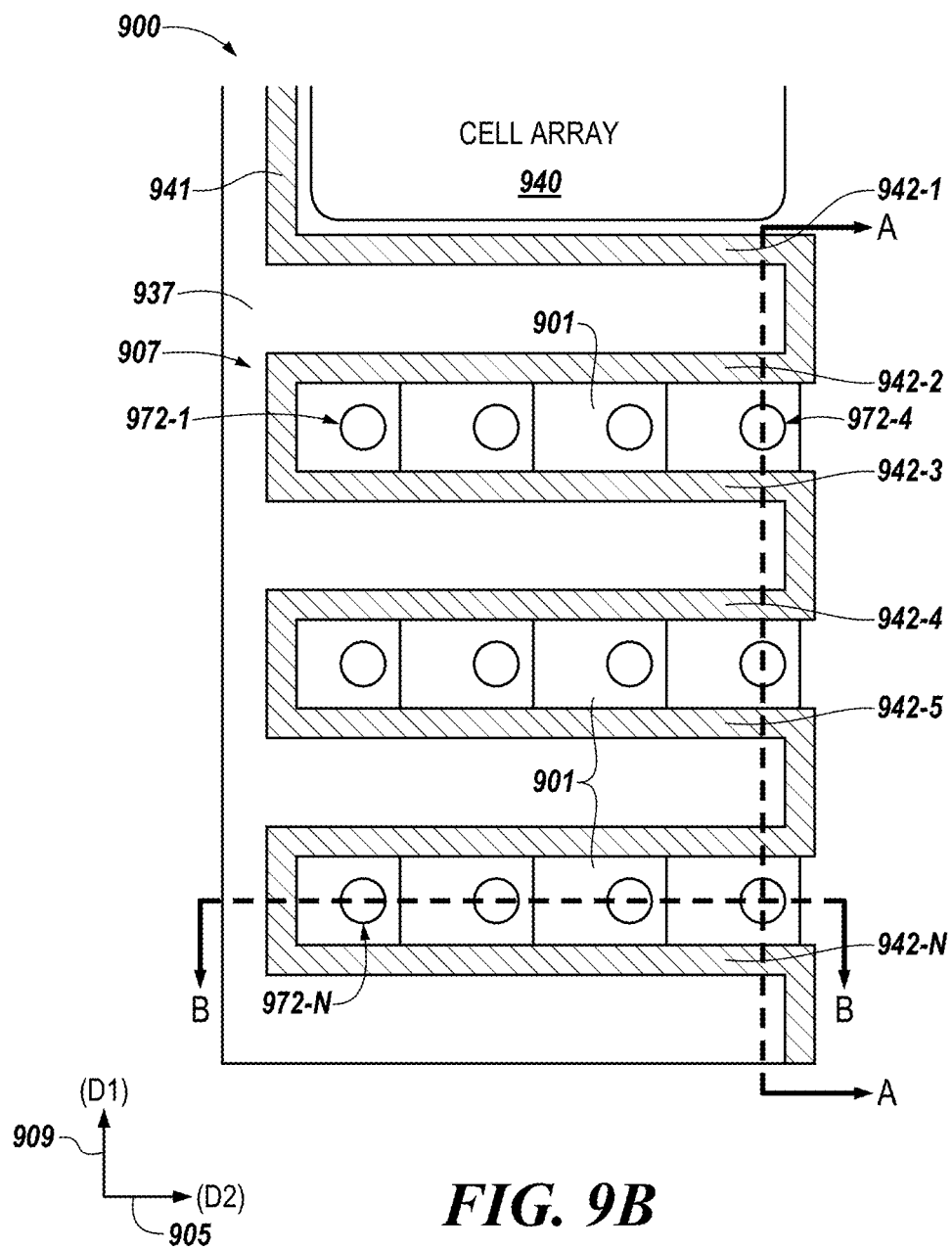

FIG. 9B illustrates another step of the method. As shown in FIG. 9B, a dielectric material 937 may be formed over region 994 of FIG. 9A. The dielectric material 937 may be formed as to make contact with one or more conductive lines (e.g., conductive line 907). Pad contact vias 972-1, . . . , 972-N may be formed between conductive line portions 942-1, . . . , 942-N. For example, one or more pad contact vias 972-1, . . . , 972-4 may be formed between portions 942-2, and 942-3 of conductive line 907. Although not shown in FIG. 9B, substrate contact openings 972-1, . . . , 972-4 may allow contact with a substrate of the staircase contact structure 901 (e.g., substrate 1000 of FIGS. 10A-F). Although not shown in FIG. 9B, staircase contact structure 901 may include one or more layers of dielectric material (e.g. dielectric material described in connection with FIGS. 10A-F and FIGS. 11A-E). Dielectric material may be removed from staircase contact structure 901 through the pad contact vias 972-1, . . . , 972-N. Although not shown in FIG. 9B, pad contact vias 972-1, . . . , 972-N be formed through a mask material.

Figure 9C:
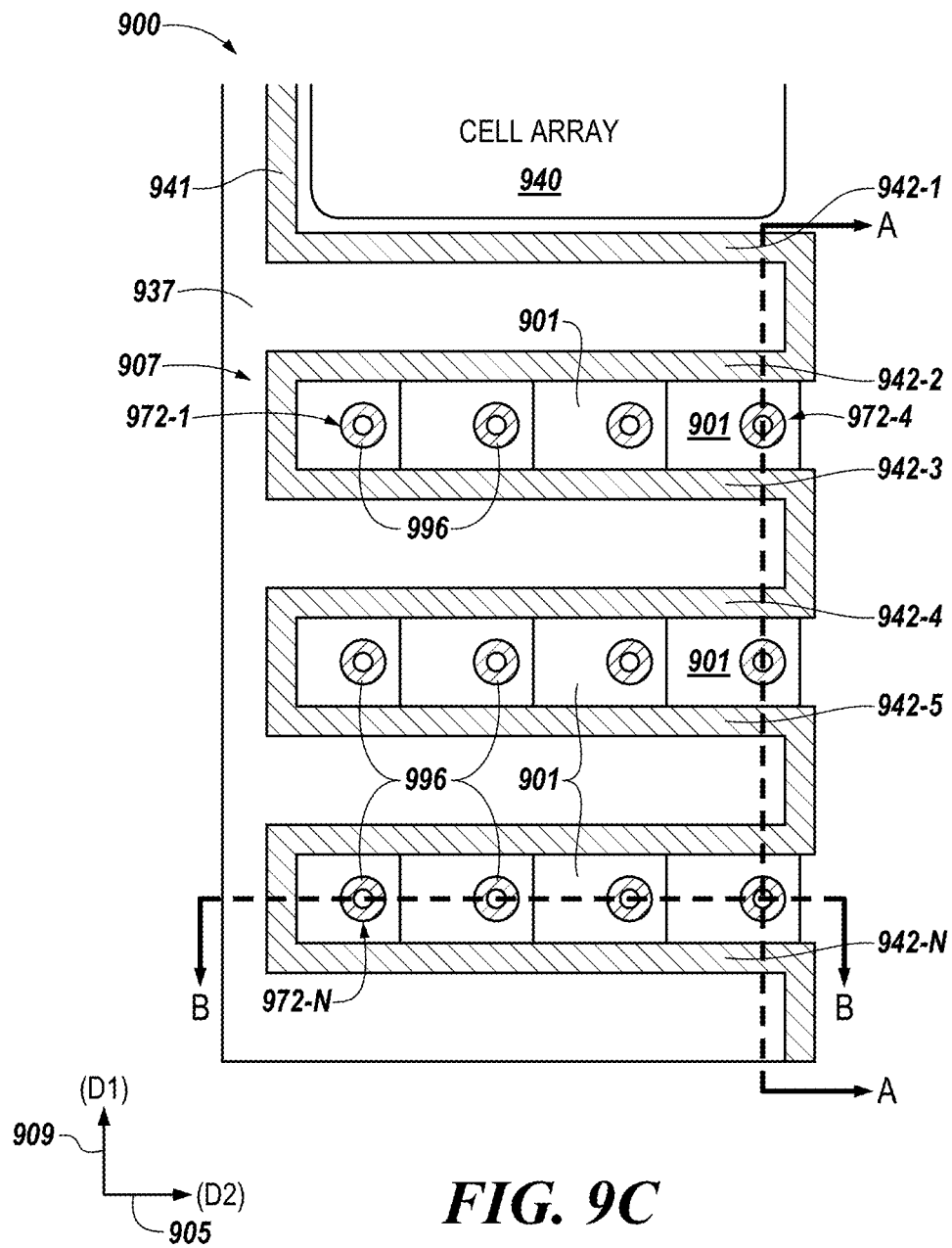

FIG. 9C illustrates another step of a method of forming a widened conductive line and staircase structure for a semiconductor device in accordance with one or more embodiments of the present disclosure. As shown in FIG. 9C, a conductive material 996 may be formed into each of the pad contact vias 972-1, . . . , 972-N. Although not shown in FIG. 9C, forming conductive material 996 may form one or more conductive pads in place of the one or more removed layers of dielectric material (see, for example, FIG. 10D). A portion of conductive material 996 may be removed from pad contact vias 972-1, . . . , 972-N so as to allow another material to be formed into the substrate contact openings 972-N and make contact with the substrate.

Figure 9D:
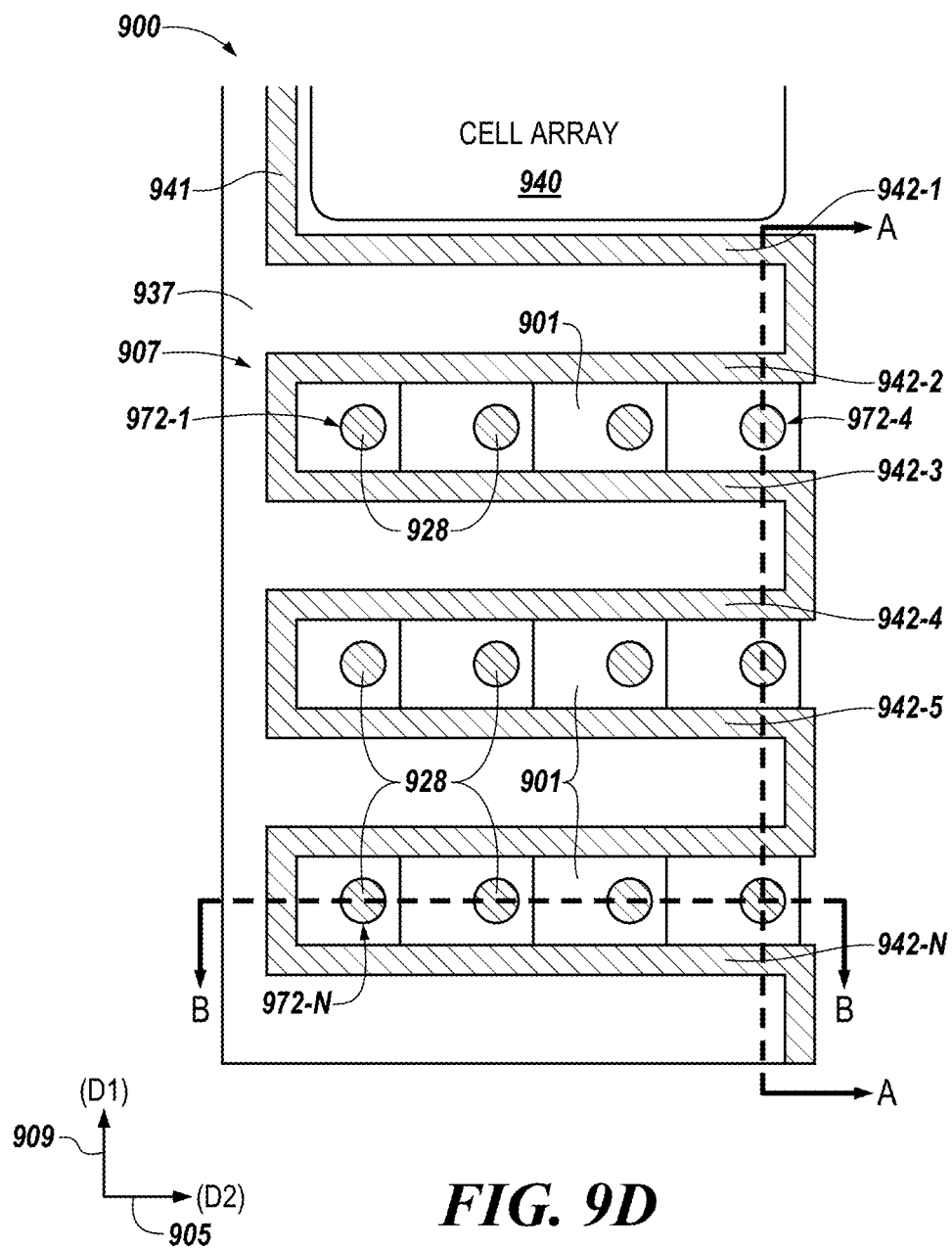

FIG. 9D illustrates another step of a method of forming a widened conductive line and staircase structure for a semiconductor device in accordance with one or more embodiments of the present disclosure. As shown in FIG. 9D, a substrate contact dielectric material 928 may be formed into each of the pad contact vias 972-1, . . . , 972-N. Although not shown in FIG. 9D, the substrate contact dielectric material 928 may serve to electrically isolate each tier of a staircase structure (e.g., tiers 1048-1, . . . , 1048-N of FIG. 10A).

Figure 9E:
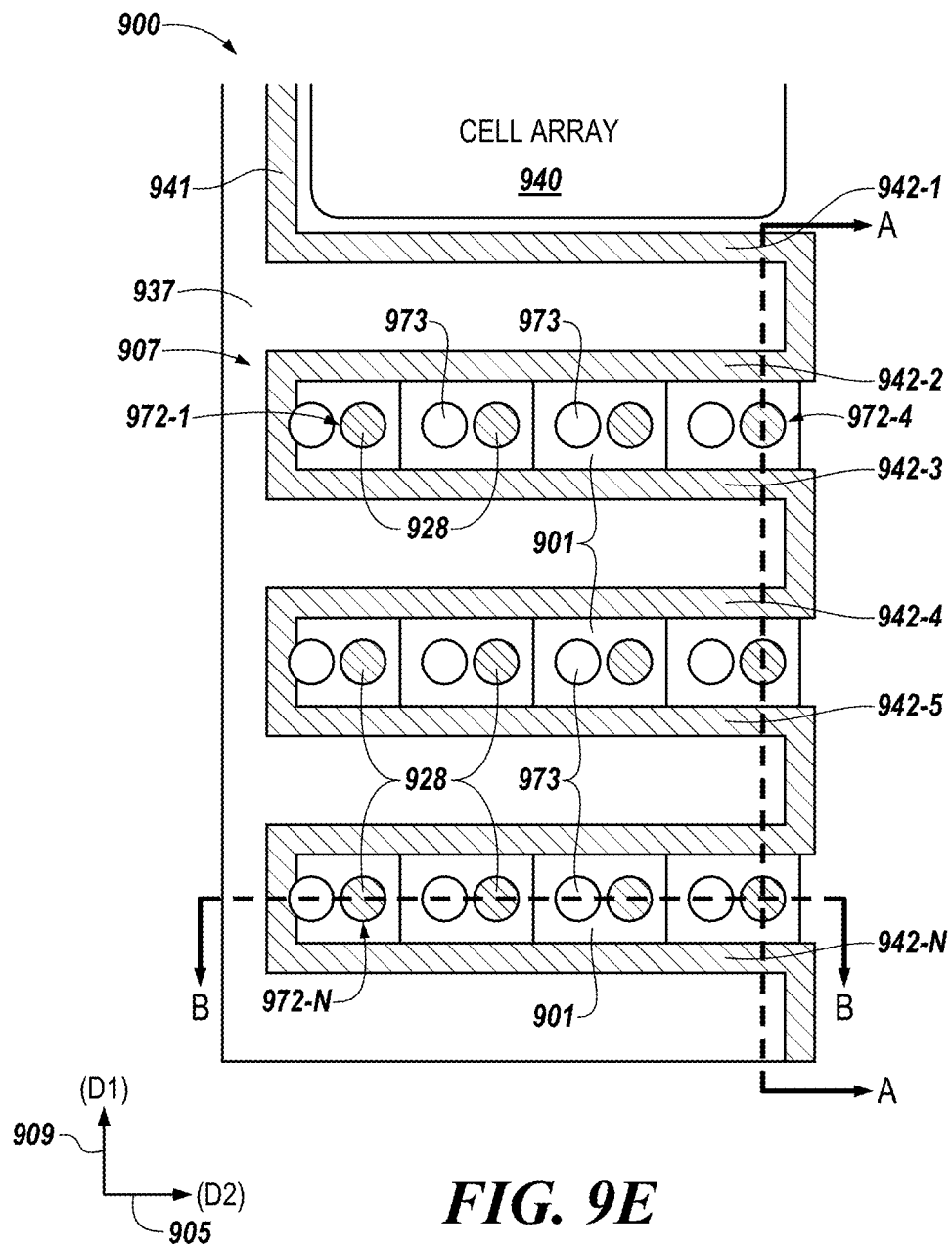

FIG. 9E illustrates another step of a method of forming a widened conductive line and staircase structure for a semiconductor device in accordance with one or more embodiments of the present disclosure. One or more conductive line contact openings 973 may be formed. Each conductive line contact opening 973 may be positioned horizontally adjacent to two pad contact vias 972-1, . . . , 972-N. Although not shown in FIG. 9E, each conductive line contact opening 973 may allow contact with the one or more conductive pads formed in the staircase contact as described in connection with FIG. 9C. A conductive material may be formed into each of the conductive line contact openings 973, thereby forming one or more conductive line contacts (e.g., conductive line contacts 1039-1, . . . , 1039-N shown in FIG. 10F).

Figure 10A:
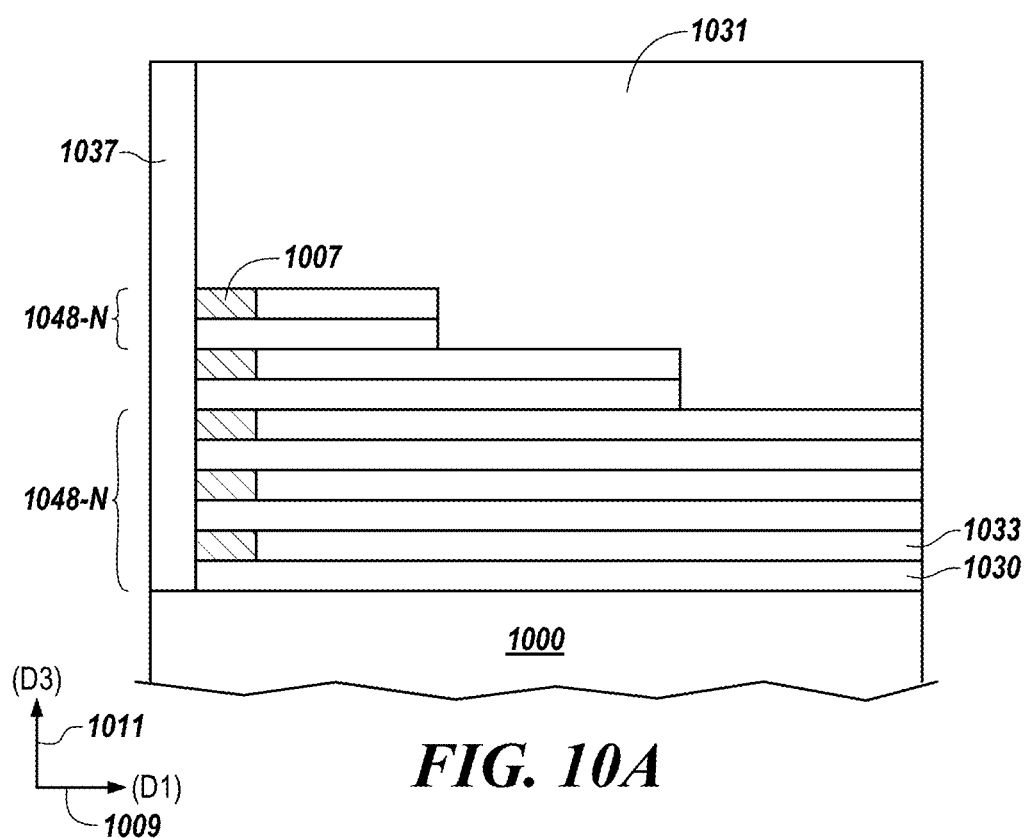
FIGS. 10A-F are a cross-sectional view of a method of forming a widened conductive line and staircase structure in accordance with one or more embodiments of the present disclosure.

FIGS. 10A-F are a cross-sectional view of a method of forming a widened conductive line and staircase structure in accordance with one or more embodiments of the present disclosure. FIGS. 10A-F are a cross-sectional view along line 'A' of FIG. 9A. FIG. 10A is a cross-sectional view of a first step of the method. As shown in FIG. 10A, a staircase contact structure 1001 such as the one described in connection with FIG. 8 may be formed on a substrate 1000. That substrate may include a dielectric material. The staircase contact structure 1001 may include repeating vertical iterations of a layer of a dielectric material 1033 and a layer of another dielectric material 1030. Dielectric materials 1033 and 1030 may include similar components. Dielectric materials 1033 and 1030 may also include similar components as the substrate 1000. For example, both the dielectric material layers 1033 and the substrate 1000 may include nitride, although embodiments of the present disclosure are not so limited. Although not shown in FIGS. 10A-F, each iteration may also include a layer of semiconductor material.

The staircase contact structure 1001 may include one or more tiers 1048-1, . . . , 1048-N. Each tier 1048-1, . . . , 1048-N may include dielectric material 1033-N and 1030-N and may be of a unique length. The tiers 1048-1, . . . , 1048-N may be ordered such that the tier of the shortest length (i.e., tier 1048-N) is the top-most tier of the staircase contact structure 1001 and the tier of the longest length (i.e., tier 1048-1) is the bottom-most tier of the staircase contact structure 1001.

Dielectric material 1037 makes contact with each conductive line 1007 of the staircase contact structure 1001. Dielectric material 1037 also can make contact with the substrate 1000 and a staircase dielectric 1031, as illustrated in FIG. 10. The staircase dielectric 1031 may be formed over layers of dielectric material 1033.

Figure 10B:
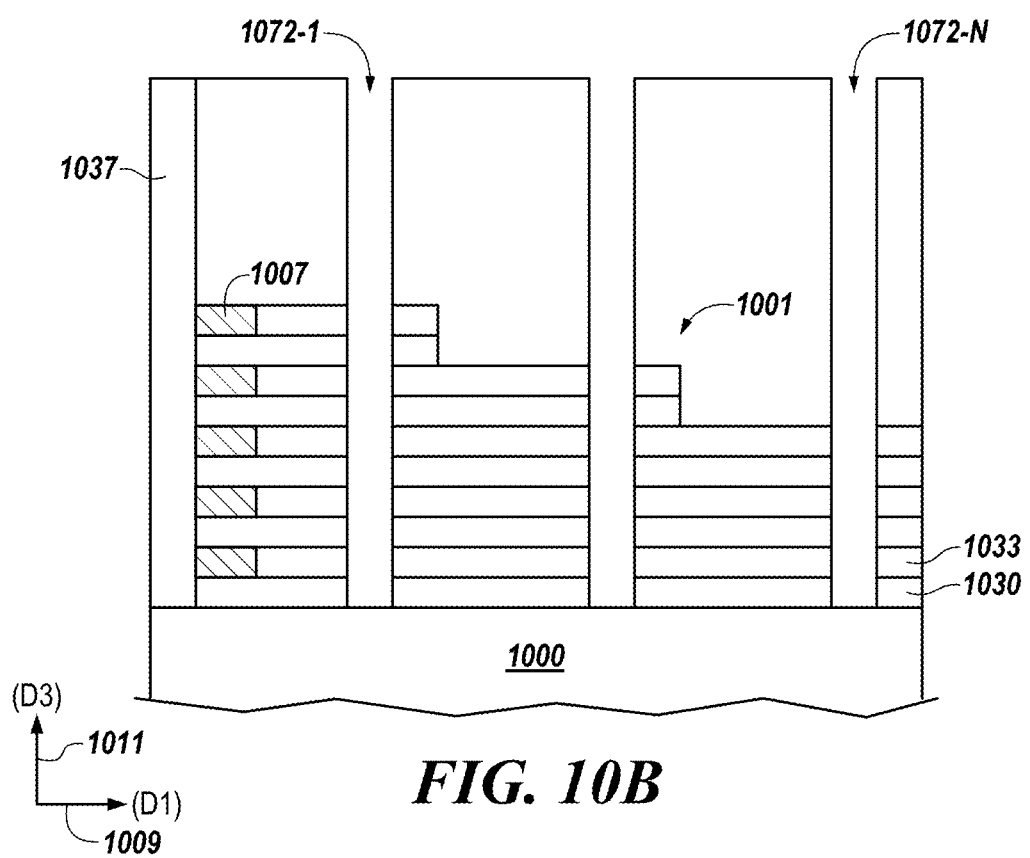

FIG. 10B is a cross-sectional view of another step of the method. A number of pad contact vias 1072-1, . . . , 1072-N are formed. The pad contact vias 1072-1, . . . , 1072-N may be vertical openings. Each of the pad contact vias 1072-1, . . . , 1072-N may intersect at least one of the layers of dielectric material 1033. Pad contact vias 1072-1, . . . , 1072-N extend down to the substrate 1000. In some embodiments, pad contact vias 1072-1, . . . , 1072-N may be more narrow near the bottom of the staircase contact structure 1001 (i.e. near the substrate 1000) than near the top of the staircase contact openings 1072 (i.e. above conductive lines 1007).

Figure 10C:
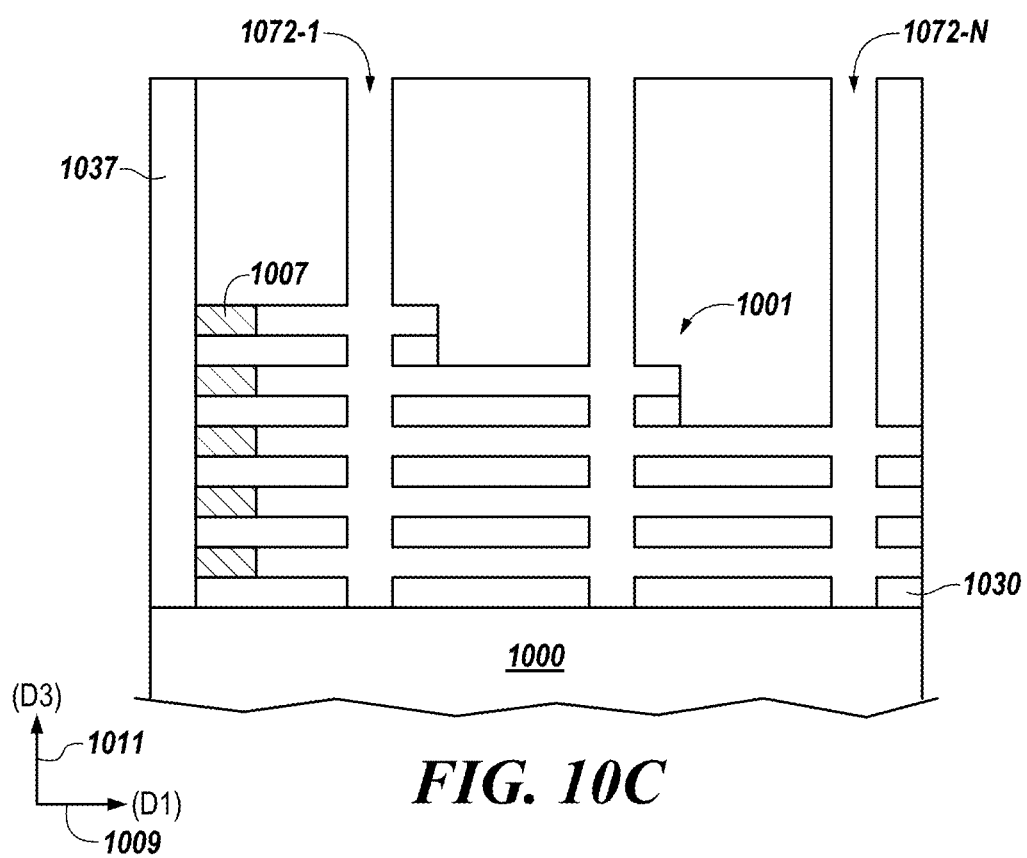

FIG. 10C is a cross-sectional view of another step of the method. Dielectric material 1033 of FIGS. 10A and 10B may be removed via the pad contact vias 1072-1, . . . , 1072-N. Dielectric material 1033 may be removed such that none of the dielectric material 1033 remains in the staircase contact structure 1001. Although dielectric material 1033 is removed, dielectric material 1030 and conductive lines 1007 may remain intact in the staircase contact structure 1001. Although not shown in FIG. 10C, if the staircase contact structure 1001 includes layers of a semiconductor material, the dielectric material 1033 may be selectively etched relative to the semiconductor material.

Figure 10D:
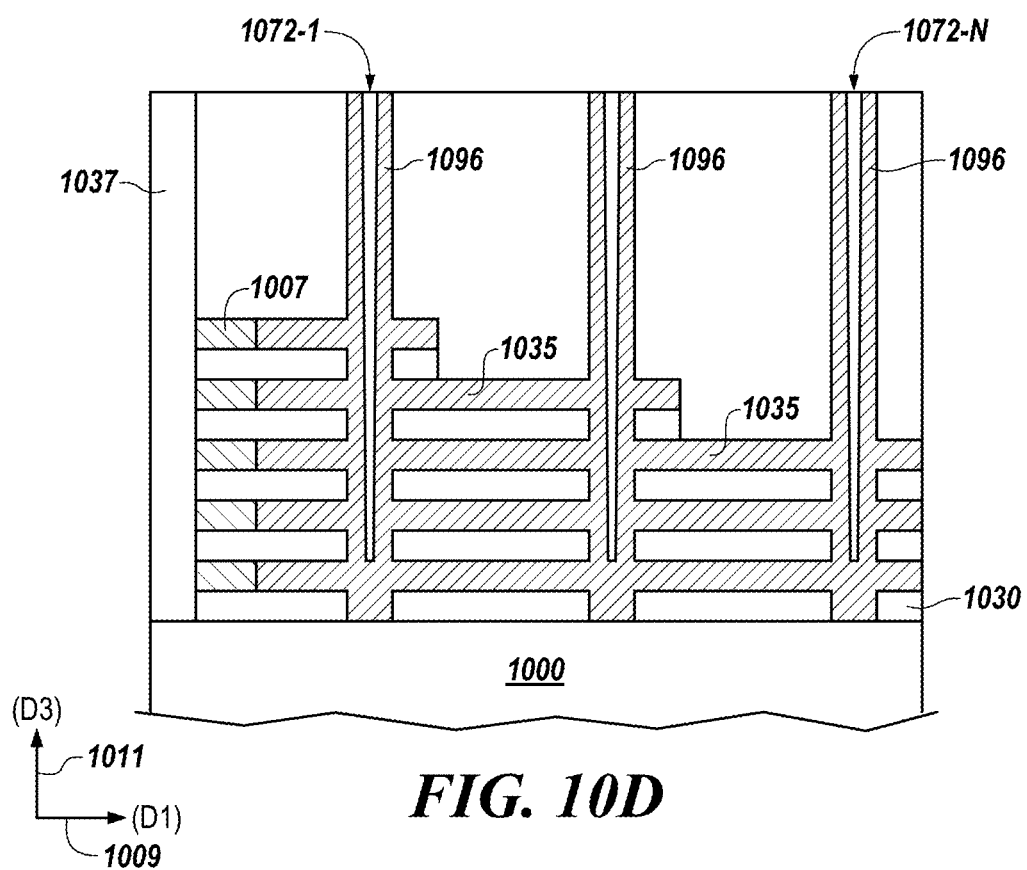

FIG. 10D is a cross-sectional view of another step of the method. A number of conductive pads 1035 may be formed by forming conductive material (e.g., conductive material 996 of FIG. 9C) into each of the pad contact vias 1072-1, . . . , 1072-N. Portions of the conductive material may be removed from each of the pad contact vias 1072-1, . . . , 1072-N. This process may expose vertical sidewalls of the conductive material. The portions of the conductive material removed may be vertical portions such that the conductive pads 1035 remain intact.

The process of removing a portion of the conductive material may include using reactive ion etching or other suitable techniques. For example, the conductive material may be etched using an atomic layer etching (ALE) process. In some embodiments, the conductive material may be etched using an isotropic etch process.

Figure 10E:
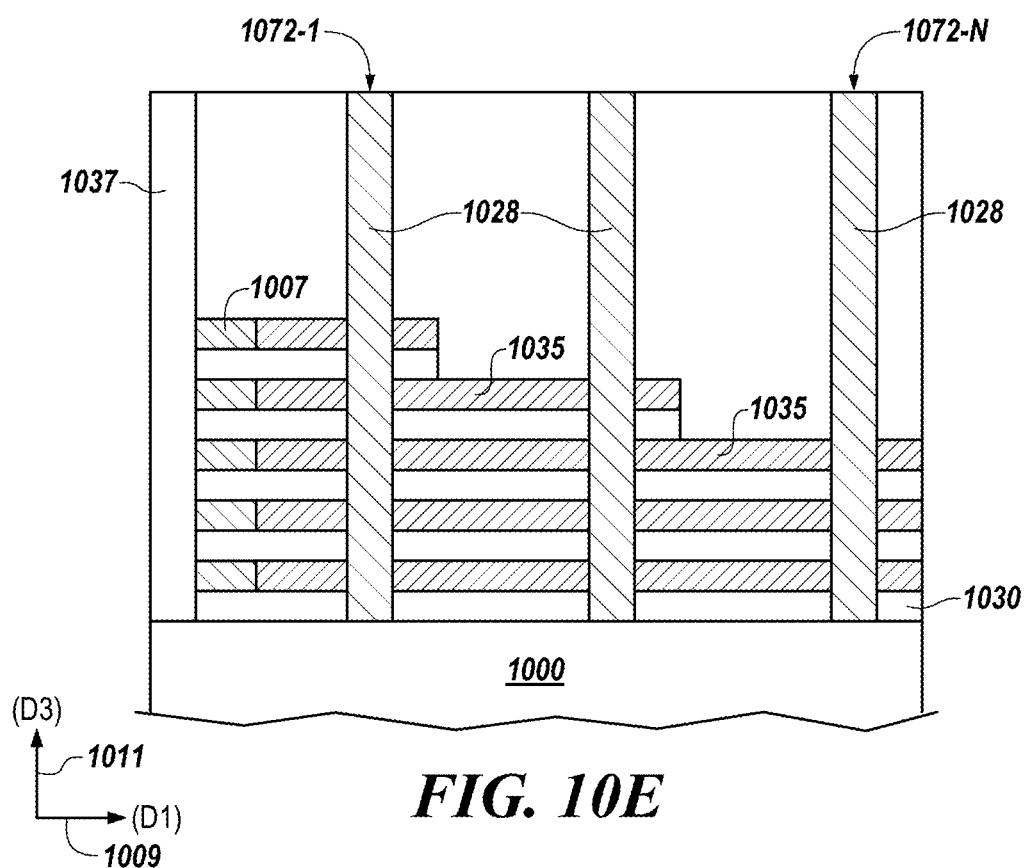

FIG. 10E is a cross-sectional view of another step of the method. A substrate contact dielectric 1028 may be formed into each of pad contact vias 1072-1, . . . , 1072-N to electrically isolate each tier 1048-1, . . . , 1048-N. In some embodiments, the substrate contact dielectric 1028 may be similar in composition to the substrate 1000. For example, the substrate contact dielectric 1028 and the substrate 1000 may each include a nitride material.

Figure 10F:
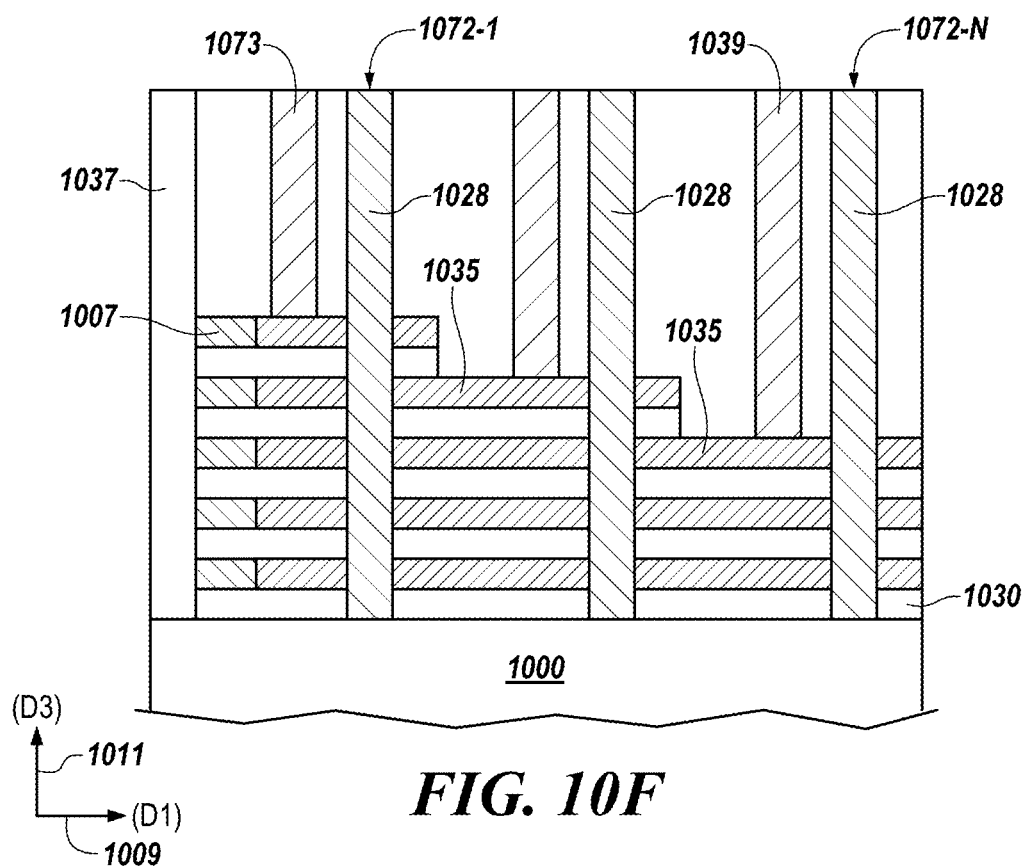

FIG. 10F is a cross-sectional view of another step of the method. A number of conductive line contact openings 1073 may be formed. As illustrated in FIG. 9F, each of the conductive line contact openings 1073 may be positioned horizontally adjacent to at least one pad contact via 1072-1, . . . , 1072-N. Each of the conductive line contact openings 1073 may allow contact with a conductive pad 1035. Another conductive material may be formed into each of the conductive line contact openings 1073 to form a number of conductive contacts 1039 to conductive lines 1007.

Figure 11A:
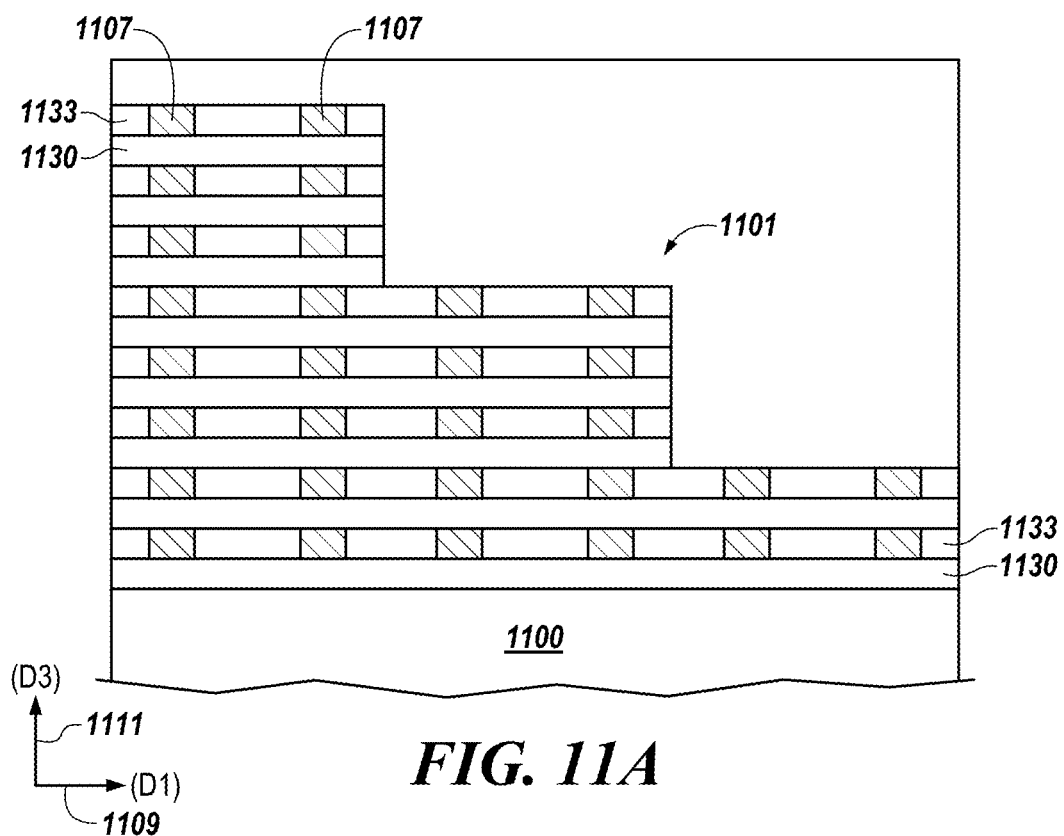
FIGS. 11A-E are another cross-sectional view of a method of forming a widened conductive line and staircase structure in accordance with one or more embodiments of the present disclosure.

FIGS. 11A-E are another cross-sectional view of a method of forming a widened conductive line and staircase structure in accordance with one or more embodiments of the present disclosure. FIGS. 11A-E illustrate a cross-sectional view of line B in FIGS. 9A and 9B. As illustrated in FIG. 11A, a staircase contact structure 1101 may include a number of layers. The number of layers may include dielectric material layers 1133, wherein each of the dielectric material layers 1133-N has two or more horizontal conductive lines 1107 formed therein. The number of layers may also include dielectric material layers 1130. Each dielectric material layer 1130 may be positioned below a dielectric material layer 1133. Although not shown in FIGS. 11A-F, staircase contact structure 1101 may also include a number of semiconductor material layers.

Figure 11B:
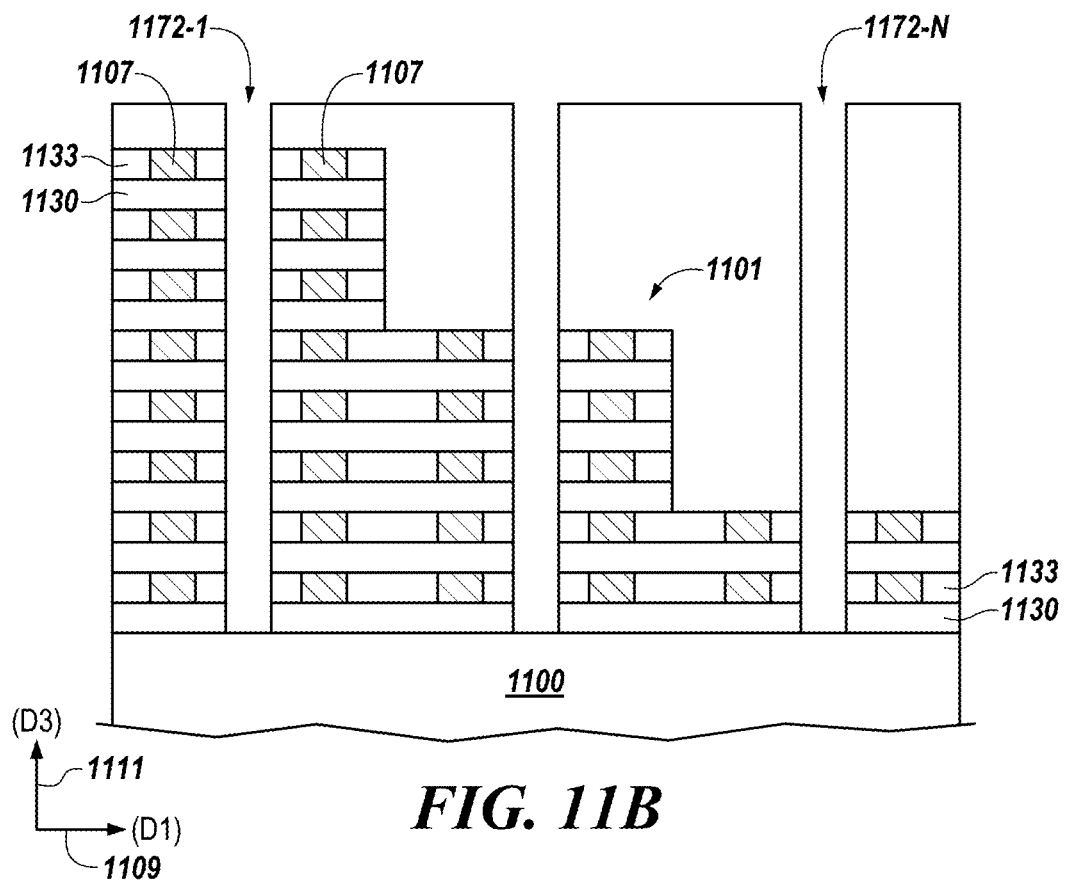

FIG. 11B illustrates another step of the method. As shown in FIG. 11B, the method may include forming a number of pad contact vias 1172-1, . . . , 1172-N. Each of the pad contact vias 1172-1, . . . , 1172-N may intersect one or more dielectric material layers 1133 and 1130. Each of the pad contact vias 1172-1, . . . , 1172-N may be positioned horizontally between two conductive lines 1107, wherein each of the two conductive lines 1107 are formed within the same dielectric material layer 1133.

Figure 11C:
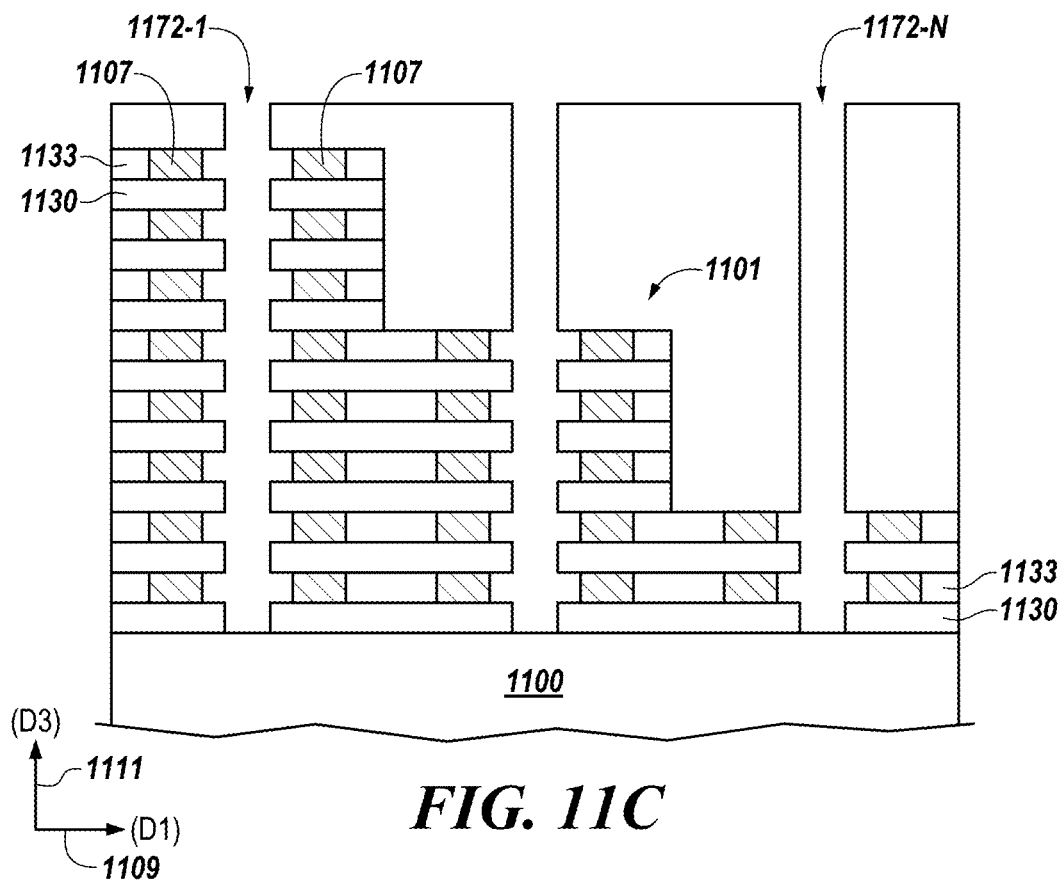

FIG. 11C illustrates another step of the method. As shown in FIG. 11C, portions of dielectric material 1133 may be selectively removed via pad contact vias 1172-1, . . . , 1172-N. As such, portions of the dielectric material 1133 may be removed while dielectric material layers 1130 remain intact. The removed portions of material 1133 may be portions between each conductive line 1107 and each substrate contact opening 1172-1, . . . , 1172-N. Likewise, intact portions of material 1133 may be portions between two conductive lines 1107.

Figure 11D:
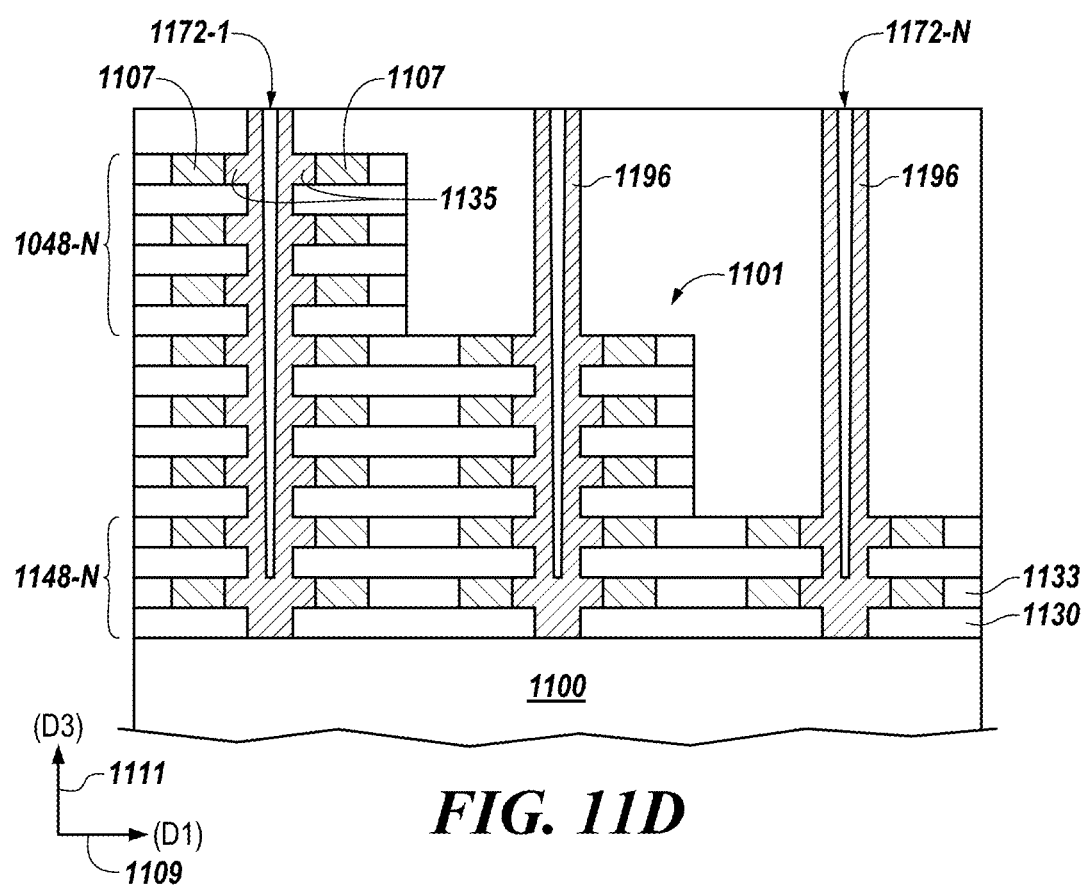

FIG. 11D illustrates another step of the method. As shown in FIG. 11D, a conductive material may be formed into each of the pad contact vias 1172-1, . . . , 1172-N. As such, horizontal conductive pads 1135 may be formed on each tier 1148-1, . . . , 1148-N of the staircase contact structure 1101.

The method may further involve removing portions of the conductive material from each of the pad contact vias 1172-1, . . . , 1172-N. The portions of the conductive material removed may be vertical portions such that conductive pads 1035 remain intact but conductive material remaining in the pad contact vias 1172-1, . . . , 1172-N has been mostly removed. The conductive pads 1135 may make contact with conductive lines 1107.

Figure 11E:
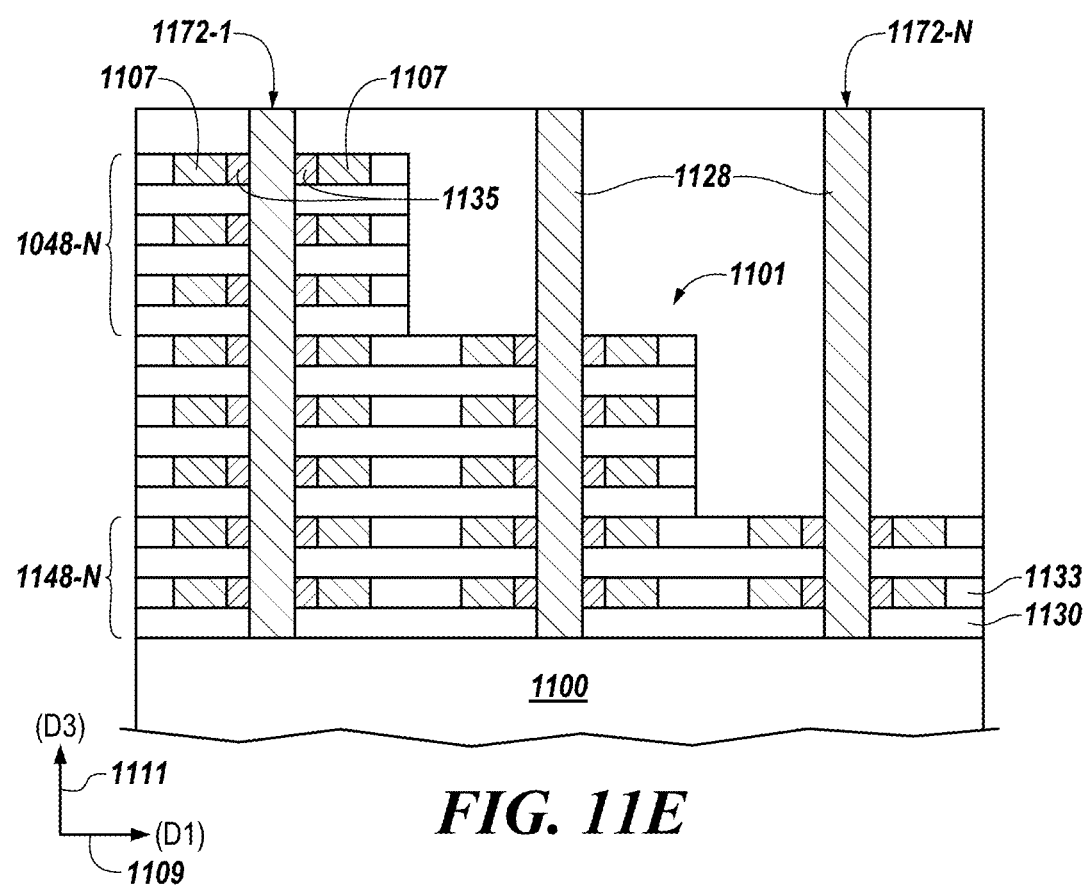

FIG. 11E illustrates another step of the method. The method may include forming a substrate dielectric 1128 into each of the pad contact vias 1172-1, . . . , 1172-N. Conductive pads 1135 may make contact with the substrate dielectric 1128 and thus serve as a contact to conductive lines 1107.

Figure 12:
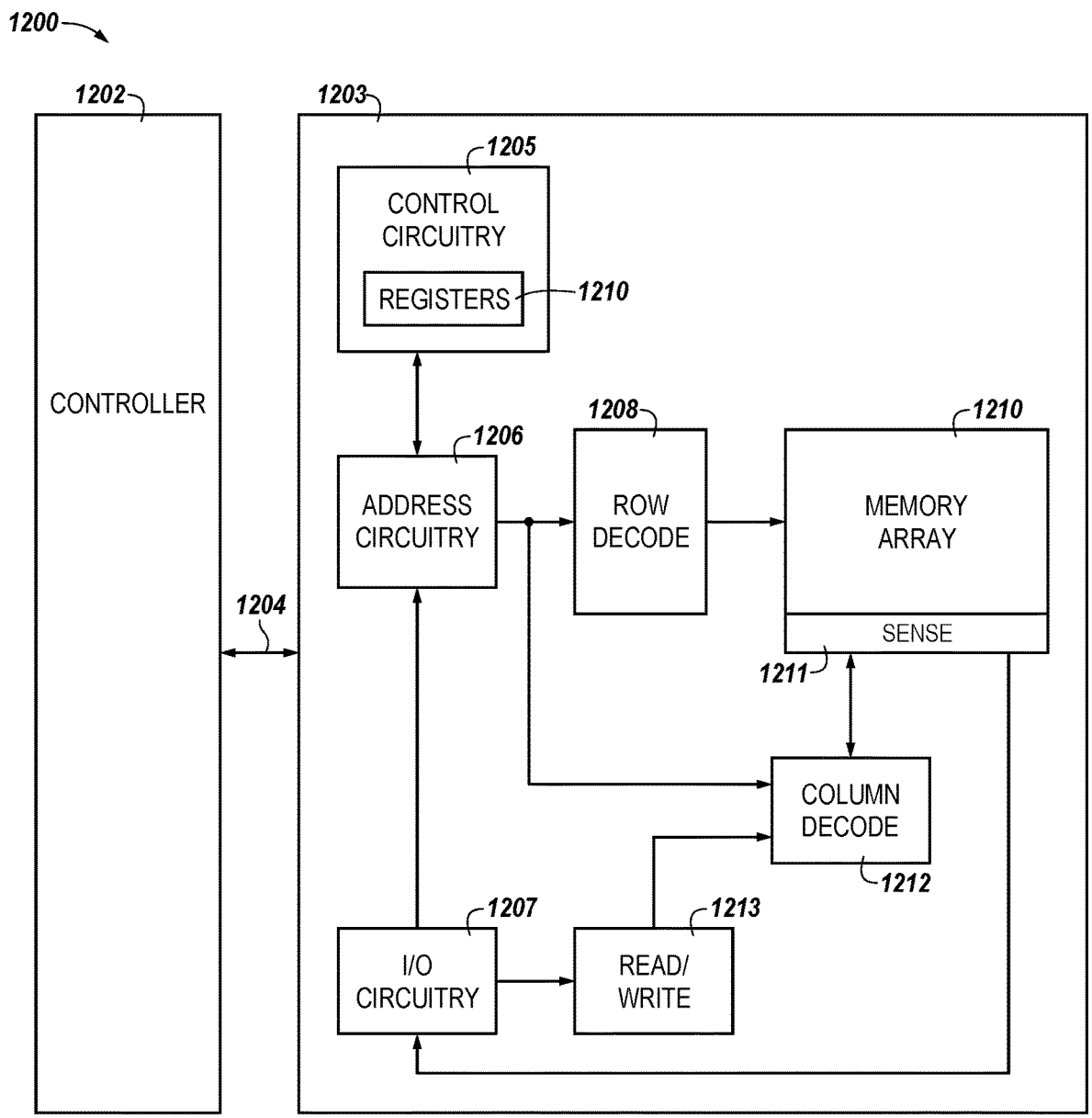
FIG. 12 is a block diagram of an apparatus in the form of a computing system including a memory device in accordance with a number of embodiments of the present disclosure.

FIG. 12 is a block diagram of an apparatus in the form of a computing system 1200 including a memory device 1203 in accordance with a number of embodiments of the present disclosure. As used herein, a memory device 1203, a memory array 1210, and/or a host 1202, for example, might also be separately considered an "apparatus." According to embodiments, the memory device 1202 may include at least one memory array 1210 with a memory cell formed having a conductive line and staircase contact, according to the embodiments described herein. A memory array 1210 may be, for example, array 840 described previously. The memory device 1202 may be, for example, a portion of a sub cell array 101-2 shown in FIG. 1 as a vertically oriented stack of memory cells in an array.

In this example, system 1200 includes a host 1202 coupled to memory device 1203 via an interface 1204. The computing system 1200 can be a personal laptop computer, a desktop computer, a digital camera, a mobile telephone, a memory card reader, or an Internet-of-Things (IoT) enabled device, among various other types of systems. Host 1202 can include a number of processing resources (e.g., one or more processors, microprocessors, or some other type of controlling circuitry) capable of accessing memory 1203. The system 1200 can include separate integrated circuits, or both the host 1202 and the memory device 1203 can be on the same integrated circuit. For example, the host 1202 may be a system controller of a memory system comprising multiple memory devices 1203, with the system controller 1205 providing access to the respective memory devices 1203 by another processing resource such as a central processing unit (CPU).

In the example shown in FIG. 12, the host 1202 is responsible for executing an operating system (OS) and/or various applications (e.g., processes) that can be loaded thereto (e.g., from memory device 1203 via controller 1205). The OS and/or various applications can be loaded from the memory device 1203 by providing access commands from the host 1202 to the memory device 1203 to access the data comprising the OS and/or the various applications. The host 1202 can also access data utilized by the OS and/or various applications by providing access commands to the memory device 1203 to retrieve said data utilized in the execution of the OS and/or the various applications.

For clarity, the system 1200 has been simplified to focus on features with particular relevance to the present disclosure. The memory array 1210 can be a DRAM array comprising at least one memory cell having multi-direction conductive lines and staircase contacts formed according to the techniques described herein. For example, the memory array 1210 can be an unshielded DL 4F2 array such as a 3D-DRAM memory array. The array 1210 can include memory cells arranged in rows coupled by word lines (which may be referred to herein as access lines or select lines) and columns coupled by conductive lines (which may be referred to herein as digit lines, sense lines, or data lines). Although a single array 1210 is shown in FIG. 1, embodiments are not so limited. For instance, memory device 1203 may include a number of arrays 1210 (e.g., a number of banks of DRAM cells).

The memory device 1203 includes address circuitry 1206 to latch address signals provided over an interface 1204. The interface can include, for example, a physical interface employing a suitable protocol (e.g., a data bus, an address bus, and a command bus, or a combined data/address/command bus). Such protocol may be custom or proprietary, or the interface 1204 may employ a standardized protocol, such as Peripheral Component Interconnect Express (PCIe), Gen-Z, CCIX, or the like. Address signals are received and decoded by a row decoder 1208 and a column decoder 1212 to access the memory array 1210. Data can be read from memory array 1210 by sensing voltage and/or current changes on the sense lines using sensing circuitry 1211. The sensing circuitry 1211 can comprise, for example, sense amplifiers that can read and latch a page (e.g., row) of data from the memory array 1210. The I/O circuitry 1207 can be used for bi-directional data communication with the host 1202 over the interface 1204. The read/write circuitry 1213 is used to write data to the memory array 1210 or read data from the memory array 1210. As an example, the circuitry 1213 can include various drivers, latch circuitry, etc.

Control circuitry 1205 decodes signals provided by the host 1202. The signals can be commands provided by the host 1202. These signals can include chip enable signals, write enable signals, and address latch signals that are used to control operations performed on the memory array 1210, including data read operations, data write operations, and data erase operations. In various embodiments, the control circuitry 1205 is responsible for executing instructions from the host 1202. The control circuitry 1205 can include a state machine, a sequencer, and/or some other type of control circuitry, which may be implemented in the form of hardware, firmware, or software, or any combination of the three. In some examples, the host 1202 can be a controller external to the memory device 1203. For example, the host 1202 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

As used herein, the term "secondary portion" may be used synonymously with the term "second portion", meaning a portion extending in a different direction than a "first portion" or "primary portion". For example, a first portion may extend in a first direction, and a number of secondary portions may extend in a second direction perpendicular to the first direction.

The terms "first portion" and "second portion" may be used herein to denote two portions of a single element. For example, a "first portion" of a conductive line and a "second portion" of a conductive line may denote two portions of a single conductive line. It is not intended that the portions referred to as the "first" and/or "second" portions have some unique meaning. It is intended only that one of the "portions" extends in a different direction than another one of the "portions"

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A semiconductor memory device, comprising:
    an array of vertically stacked memory cells, having:
        a vertical stack of horizontally oriented multi-directional conductive lines, each multi-directional conductive line comprising:
            a first portion extending in a first horizontal direction;
            a plurality of second portions, wherein each second portion of the plurality of second portions extends from the first portion in a second horizontal direction, and wherein each second portion of the plurality of second portions is wider than the first portion; and
            a plurality of conductive line contacts that are formed between the second portions to allow for a direct contact with conductive layers of a staircase contact structure, wherein the conductive layers are in direct contact with conductive lines formed within the staircase contact structure.

2. The semiconductor memory device of claim 1, wherein the second horizontal direction is at an angle approximately perpendicular to the first horizontal direction.

3. The semiconductor memory device of claim 1, wherein the staircase contact structure includes a decreasing vertical height along the first horizontal direction and the second horizontal direction.

4. The semiconductor memory device of claim 3, wherein lengths of the plurality of second portions ascend from a bottom to a top of the staircase contact structure.

5. The semiconductor memory device of claim 4, wherein the plurality of conductive line contacts form doped body contacts to the conductive layers of the staircase contact structure.

6. The semiconductor memory device of claim 1, wherein the memory device is a three-dimensional (3D) dynamic random-access memory device.

7. The semiconductor memory device of claim 1, further comprising a number of vertical openings configured to allow contact with a dielectric layer beneath the vertical stack of horizontally oriented multi-directional conductive lines.

8. The semiconductor memory device of claim 1, further comprising:
    a number of layers wherein the horizontally oriented multi-directional conductive lines are formed, each layer comprising at least one of:
        a conductive material; and
        a dielectric material; and
    an additional number of vertical openings, each vertical opening being configured to allow contact with at least one of the number of layers.

9. The semiconductor memory device of claim 8, wherein the additional number of vertical openings are formed between the second portions.

10. The semiconductor memory device of claim 8, wherein the conductive layers of the staircase contact structure are formed using the vertical openings.

11. The semiconductor memory device of claim 1, wherein the vertical stack of horizontally oriented multi-directional conductive lines decreases in vertical height along the first horizontal direction and along the second horizontal direction.

\* \* \* \* \*